United States Patent
Uehara

(10) Patent No.: US 8,344,618 B2
(45) Date of Patent: Jan. 1, 2013

(54) LIGHT EMITTING DEVICE, METHOD FOR MANUFACTURING THE LIGHT EMITTING DEVICE, ELECTRONIC DEVICE PROVIDED WITH THE LIGHT EMITTING DEVICE AND ELECTRONIC EQUIPMENT PROVIDED WITH THE ELECTRONIC DEVICE

(75) Inventor: Masamitsu Uehara, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1239 days.

(21) Appl. No.: 11/921,875

(22) PCT Filed: Jun. 9, 2006

(86) PCT No.: PCT/JP2006/311652
§ 371 (c)(1),
(2), (4) Date: Dec. 10, 2007

(87) PCT Pub. No.: WO2006/132374
PCT Pub. Date: Dec. 14, 2006

(65) Prior Publication Data
US 2009/0146550 A1  Jun. 11, 2009

(30) Foreign Application Priority Data
Jun. 10, 2005 (JP) .................. 2005-170457

(51) Int. Cl.
*H01J 1/62* (2006.01)

(52) U.S. Cl. ............................................... 313/506

(58) Field of Classification Search ........... 313/495–512
See application file for complete search history.

(56) References Cited

U.S. PATENT DOCUMENTS

| 6,265,823 | B1 | 7/2001 | Dobson et al. |
| 6,683,244 | B2 * | 1/2004 | Fujimori et al. ............... 136/263 |
| 2007/0007538 | A1 * | 1/2007 | Ono et al. ....................... 257/79 |

FOREIGN PATENT DOCUMENTS

| JP | A 8-279628 | 10/1996 |
| JP | A 9-255744 | 9/1997 |
| JP | A 11-162640 | 6/1999 |
| JP | A 2000-58905 | 2/2000 |
| JP | A 2002-117984 | 4/2002 |
| JP | A 2005-26275 | 1/2005 |
| WO | WO 2004/004024 A2 | 1/2004 |
| WO | WO 2004/112440 | * 12/2004 |

* cited by examiner

*Primary Examiner* — Anh Mai
*Assistant Examiner* — Zachary J Snyder
(74) *Attorney, Agent, or Firm* — Oliff & Berridge, PLC

(57) ABSTRACT

A light emitting device includes a cathode, an anode, a light emitting layer provided between the cathode and the anode, an intermediate layer provided between the cathode and the light emitting layer so as to be in contact with both the cathode and the light emitting layer. The intermediate layer includes a base in the form of a layer, the base being constituted of a metal oxide based semiconductor material as a main component thereof and having a first surface which is in contact with the light emitting layer and a second surface opposite to the first surface, and a dye carried on the first surface of the base and inner surfaces of pores formed in the base so as to be in contact with the light emitting layer. By using the light emitting device mentioned above, it is possible to improve properties of the light emitting device such as luminous efficiency and the like. A method for manufacturing such a light emitting device is also provided. An electronic device provided with such a light emitting device is also provided. Electronic equipment provided with such an electronic device is also provided.

11 Claims, 9 Drawing Sheets

LIGHT EMITTING DEVICE, METHOD FOR MANUFACTURING THE LIGHT EMITTING DEVICE, ELECTRONIC DEVICE PROVIDED WITH THE LIGHT EMITTING DEVICE AND ELECTRONIC EQUIPMENT PROVIDED WITH THE ELECTRONIC DEVICE

BACKGROUND

1. Technical Field

The present invention relates to a light emitting device, a method for manufacturing the light emitting device, an electronic device provided with the light emitting device, and electronic equipment provided with the electronic device.

2. Related Art

Electroluminescent devices using organic semiconductor materials (hereinafter, simply referred to as an "organic EL device") have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

At this time, in the case where a molecular structure of organic EL materials (light emitting layer materials) is a specific structure or an aggregation state of molecules of the organic EL materials is a specific state, the injected electrons can not be combined with the holes immediately, and therefore the injected electrons and the holes are retained for a certain period of time in a specific excitation state.

Therefore, in such a specific excitation state, total energy of the molecules increases only for an amount of excitation energy as compared to a ground state which is a normal state. Pairs of the electrons and the holes which are being retained in such a specific excitation state are referred to as exciter (exciton).

After a lapse of the certain period of time, when the exciter disintegrates and thereby the electrons are combined with the holes, the increased excitation energy is released to the outside of the organic EL device as heat and/or light.

The light is released in the vicinity of the light emitting layer. A quantity of the released light based on the excitation energy is affected by the molecular structure of the organic EL materials or the aggregation state of the molecules of the organic EL materials significantly.

In such an organic EL device, it has been known that a layered device structure, in which an organic semiconductor layer formed of organic semiconductor materials having different carrier transport properties for carriers (electrons or holes) is provided between a light emitting layer and a cathode and/or an anode, is effective in obtaining high luminance.

In order to obtain high luminous efficiency in such an organic EL device having a structure in which a light emitting layer and an organic semiconductor layer (hereinafter, referred to as "organic semiconductor layers") are provided between an anode and a cathode, extensive researches and studies are conducted on molecular structures of organic EL materials and organic semiconductor materials to be used, aggregation states of molecules of these materials, a number of the organic semiconductor layers, a laminated position thereof, and the like.

However, even in the organic EL devices modified as described above, characteristics such as luminous efficiency and the like are not so improved as to meet expectations in actuality (see JP-A H09-255774, for example).

Recently, the reason why such sufficient characteristics improvement cannot be obtained has been roughly known. Namely, in such organic EL devices, interaction between a constituent material of each electrode (metal material) and an organic semiconductor material of an organic semiconductor layer adjacent to the electrode is larger than interaction between the organic semiconductor materials of the adjacent organic semiconductor layers.

Therefore, sufficient adhesion cannot be obtained between the organic semiconductor layer and each electrode, so that transfer of the carriers is not carried out smoothly between the organic semiconductor layer and the electrode.

SUMMARY

Accordingly, it is an object of the present invention to provide a light emitting device having improved properties such as high luminous efficiency and the like, a method for manufacturing the light emitting device, an electronic device provided with the light emitting device, and electronic equipment provided with the electronic device and having high reliability.

The object is achieved by the present invention described below. In a first aspect of the present invention, there is provided a light emitting device. The light emitting device is provided with a cathode, an anode, a light emitting layer provided between the cathode and the anode, and an intermediate layer provided between the cathode and the light emitting layer in contact with both the cathode and the light emitting layer. The intermediate layer comprises a base in the form of a layer, the base being constituted of at least one metal oxide based semiconductor material as a main component thereof and having a first surface which is in contact with the light emitting layer and a second surface opposite to the first surface, and a dye carried on at least the first surface of the base so as to be in contact with the light emitting layer.

This makes it possible to transfer electrons from the cathode to the light emitting layer through the intermediate layer smoothly and therefore it is possible to obtain a light emitting device having improved properties such as high luminous efficiency and the like.

In the light emitting device according to the present invention, it is preferred that at least one metal oxide based semiconductor material includes at least one of zinc oxide and cadmium oxide.

Since these materials exhibit especially excellent adhesion with the dye and they have high hole transport ability, they are preferably used as the metal oxide based semiconductor material.

In the light emitting device according to the present invention, it is preferred that the base is formed into a porous structure having many pores defined by inner surfaces, and the dye is carried on the first surface of the base as well as the inner surfaces of the pores.

This makes it possible to increase an amount of the dye carried on the base.

In the light emitting device according to the present invention, it is preferred that the pores exist in the base in an unevenly distributed manner to the side of the first surface of the base in a thickness direction thereof.

This makes it possible to more efficiently transfer the electrons between the light emitting layer and the dye as well as between the cathode and the base.

In the light emitting device according to the present invention, it is preferred that an average porosity of the pores of the base is in the range of 20 to 60%.

This makes it possible to enlarge a surface area of the inner surfaces of the pores while preventing mechanical strength of the base from being lowered, so that it is possible to enter a large amount of a constituent material of the light emitting layer into the pores with allowing a large amount of the dye to adhere onto the inner surfaces.

In the light emitting device according to the present invention, it is preferred that a part of the light emitting layer enters into the pores.

This makes it possible to increase a contact area between the dye and the light emitting layer, and thereby it is possible to transfer the electrons therebetween smoothly with increasing adhesion between the intermediate layer and the light emitting layer.

In the light emitting device according to the present invention, it is preferred that the dye is constituted of at least one of a coupling polycyclic dye and a fused polycyclic dye as a main component thereof.

Since these dyes include a large number of bonds of conjugated system in a structure thereof and have excellent affinity with the metal oxide based semiconductor material, they can exhibit especially excellent hole transport ability. Therefore, they can be preferably used as the dye.

In the light emitting device according to the present invention, it is preferred that the coupling polycyclic dye is at least one of tetra-thiofulvalene, coumarin 6, rubrene, 1,1,4,4-tetraphenyl-1,3-butadiene, 2-(4-tert-butylphenyl)-5-(4-biphenyl)-1,3,4-oxadiazol, 2,5-bis(1-naphtyl)-1,3,4-oxadiazol, 3-(4-biphenyl)-4-phenyl-5-(4-tert-butylphenyl)-1,3,4-triazol, and 1,3-bis[5-(p-4-tert-butylphenyl)-1,3,4-oxadiazol-2-yl]benzene.

Since these dyes include a large number of bonds of conjugated system in a structure thereof and have excellent affinity with the metal oxide based semiconductor material, they can exhibit especially excellent hole transport ability. Therefore, they can be preferably used as the dye.

In the light emitting device according to the present invention, it is preferred that the fused polycyclic dye is at least one of coumarin 343, Nile red, perylene, quinacridone, and N,N'-dimethylquinacridone.

Since these dyes include a large number of bonds of conjugated system in a structure thereof and have excellent affinity with the metal oxide based semiconductor material, they can exhibit especially excellent hole transport ability. Therefore, they can be preferably used as the dye.

In the light emitting device according to the present invention, it is preferred that an average thickness of the intermediate layer is in the range of 1 to 500 nm.

This helps to make the light emitting device thinner while transferring the electrons from the cathode to the light emitting layer through the intermediate layer reliably.

In the light emitting device according to the present invention, it is preferred that the cathode is constituted of conductive metal oxides as a main component thereof.

This makes it possible for the cathode to have a relatively stable characteristic with respect to oxygen or moisture. Therefore, it is possible to omit formation of a sealing member on and around the cathode. As a result, it is possible to reduce the size of the light emitting device and the production cost thereof.

In a second aspect of the present invention, there is provided a method for manufacturing a light emitting device. In the method for manufacturing a light emitting device, the light emitting device is provided with a cathode, an anode, a light emitting layer provided between the cathode and the anode, and an intermediate layer provided between the cathode and the light emitting layer in contact with both the cathode and the light emitting layer.

The method is characterized in that: the intermediate layer is formed by forming a base in the form of a layer on one surface of the cathode by an electrolytic plating method, and then allowing a dye to be carried on at least an opposite surface of the base with respect to the cathode; the light emitting layer is then formed on the opposite surface of the base of the intermediate layer so as to contact with the dye; and the anode is then formed on an opposite surface of the light emitting layer with respect to the intermediate layer.

This makes it possible to transfer the electrons from the cathode to the light emitting layer through the intermediate layer smoothly and thereby it is possible to obtain a light emitting device having improved properties such as high luminous efficiency and the like.

In the method for manufactured the light emitting device according to the present invention, it is preferred that in a step of forming the intermediate layer, the electrolytic plating method is carried out using a plating solution containing an organic compound and a metal oxide based semiconductor material to thereby form a plating layer on the one surface of the cathode, and then the organic compound is removed from the plating layer, whereby the base is formed into a porous structure having many pores.

According to the method, it is possible to control the size of the pores to be formed in the base easily, and therefore it is possible to form more fine pores in the base.

In the method for manufactured the light emitting device according to the present invention, it is preferred that in the step of forming the intermediate layer, the dye is carried on the opposite surface of the base with respect to the cathode as well as the inner surfaces of the pores.

In the method for manufactured the light emitting device according to the present invention, it is preferred that the organic compound is constituted of at least one of compounds having a 9-phenylxanthene skeleton and compounds having a diphenylmethane skeleton as a main component thereof.

Use of such an organic compound makes it possible to remove the organic compound without eluting the metal oxide based semiconductor material from the plating layer after the plating layer has been formed on the cathode through the precipitation of the organic compound and the metal oxide based semiconductor material.

In the method for manufactured the light emitting device according to the present invention, it is preferred that the compounds having the 9-phenylxanthene skeleton contain at least one of 2',4',5',7'-tetrabromofluorescein-disodium salt, fluorescein-disodium salt, rhodamine B, and erythrosine.

Use of such an organic compound makes it possible to remove the organic compound without eluting the metal oxide based semiconductor material from the plating layer after the plating layer has been formed on the cathode through the precipitation of the organic compound and the metal oxide based semiconductor material.

In the method for manufactured the light emitting device according to the present invention, it is preferred that the compounds having the diphenylmethane skeleton contain at least one of crystal violet, malachite green, and auramine O.

Use of such an organic compound makes it possible to remove the organic compound without eluting the metal oxide based semiconductor material from the plating layer after the plating layer has been formed on the cathode through the precipitation of the organic compound and the metal oxide based semiconductor material.

In a third aspect of the present invention, there is provided an electronic device. The electronic device provided with the light emitting device described above.

This makes it possible to obtain an electronic device having high reliability and provided with the light emitting device having the excellent properties.

In a fourth aspect of the present invention, there is provided an electronic device provided with the light emitting device. In the electronic device, the light emitting device is manufactured by the method for manufacturing the light emitting device described above.

This makes it possible to obtain an electronic device having high reliability and provided with the light emitting device having the excellent properties.

In a fifth aspect of the present invention, there is provided electronic equipment. The electronic equipment is provided with the electronic device described above.

This makes it possible to obtain electronic equipment having high reliability.

DESCRIPTION OF EXEMPLARY EMBODIMENTS

Hereinbelow, a light emitting device, a method for manufacturing the light emitting device, an electronic device provided with the light emitting device, and electronic equipment provided with the electronic device according to the present invention will be described in detail based on preferred embodiments shown in the accompanying drawings.

Light Emitting Device

First Embodiment

Hereinafter, description will be made on a first embodiment of a light emitting device.

Figure 1:
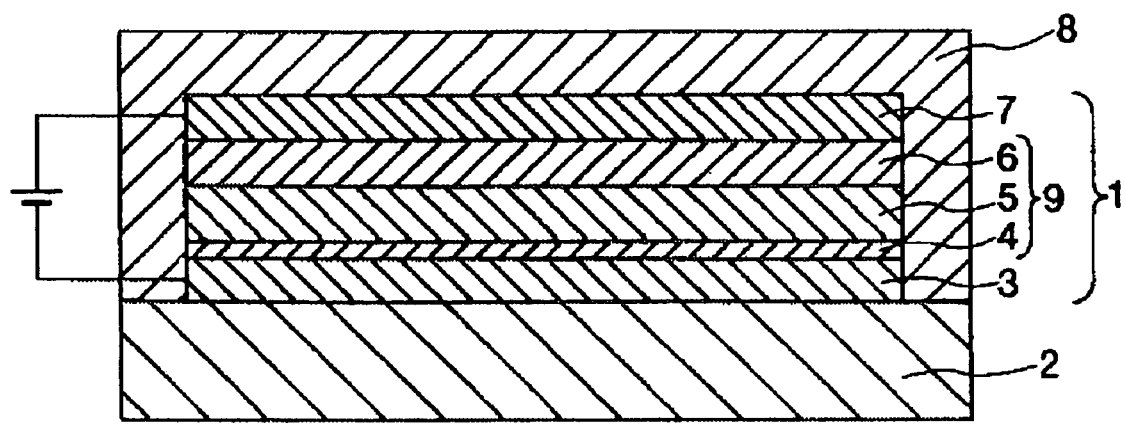
FIG. 1 is a vertical sectional view which shows a first embodiment of a light emitting device in accordance with the present invention.
Figure 2:
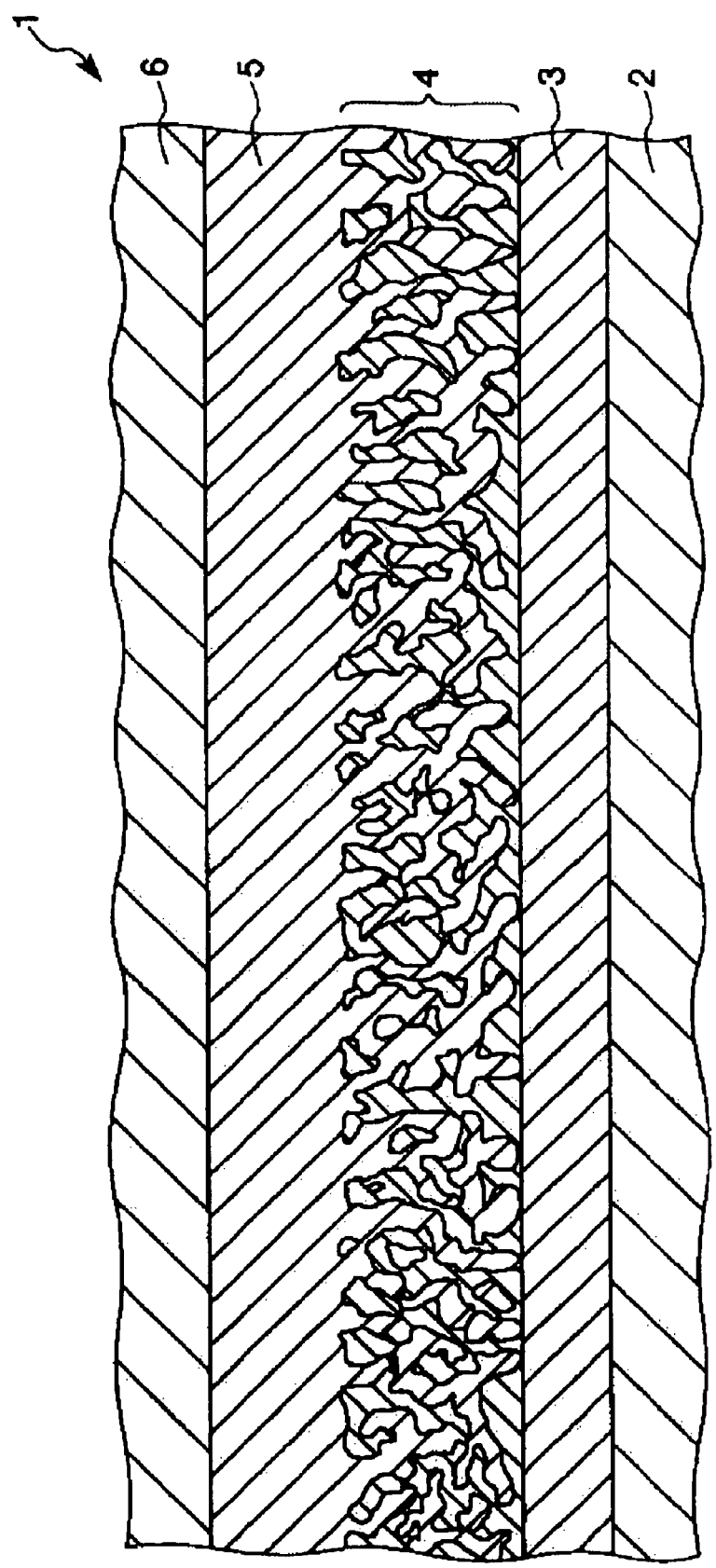
FIG. 2 is an enlarged sectional view of the light emitting device shown in FIG. 1, in which boundaries of the adjacent layers are shown.
Figure 3:
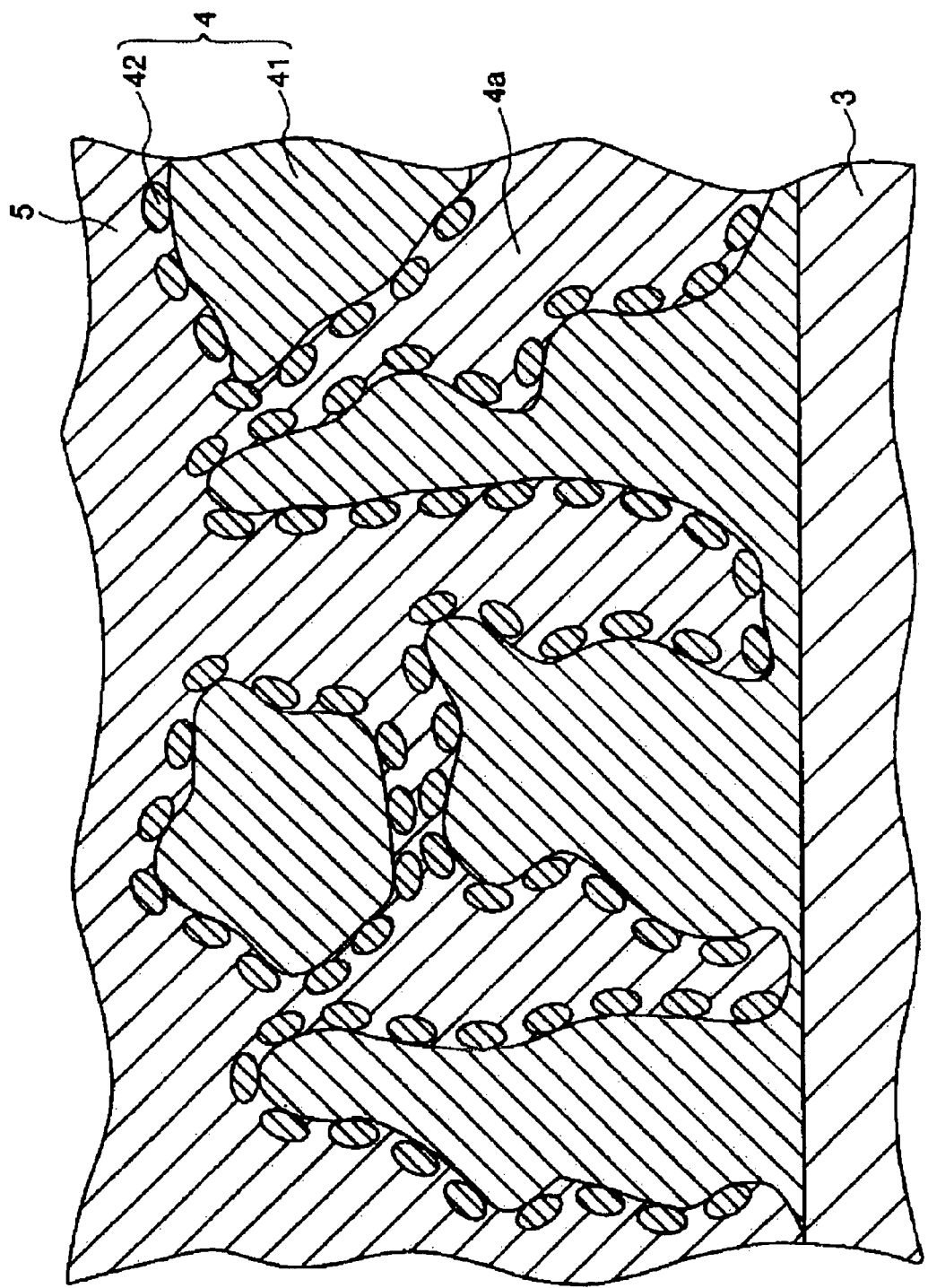
FIG. 3 is a more enlarged vertical sectional which shows the vicinity of a boundary of an intermediate layer and a light emitting layer in the light emitting device shown in FIG. 1.

FIG. 1 is a vertical sectional view which shows a first embodiment of a light emitting device in accordance with the present invention. FIG. 2 is an enlarged sectional view of the light emitting device shown in FIG. 1, in which boundaries of the adjacent layers are shown. FIG. 3 is a more enlarged vertical sectional view which shows the vicinity of a boundary of an intermediate layer and a light emitting layer in the light emitting device shown in FIG. 1.

In the following description, the upper side in FIGS. 1 to 3 will be referred to as "upper" and the lower side thereof will be referred to as "lower" for convenience of explanation.

The light emitting device 1 shown in FIG. 1 is provided with a cathode 3, an anode 7, and laminated layers 9 provided between the cathode 3 and the anode 7. The laminated layers 9 include an intermediate layer 4, a light emitting layer 5, and a hole transport layer 6 which are laminated in this order from the side of the cathode 3.

The whole of the light emitting device 1 is provided on a substrate 2 and is sealed by a sealing member 8.

The substrate 2 serves as a support for the light emitting device 1. It is to be noted that in the case where the light emitting device 1 has a structure in which light is emitted from the opposite side of the substrate 2 (that is, a top emission type), the substrate 2 and the cathode 3 are not required to have transparency.

On the other hand, in the case where the light emitting device 1 has a structure in which light is emitted from the side of the substrate 2 (that is, a bottom emission type), both the substrate 2 and the cathode 3 are respectively required to be formed of materials having substantially transparency (that is, transparent and colorless, colored and transparent, or translucent).

Examples of such a substrate 2 include: a transparent substrate formed of a resin material such as polyethylene terephthalate, polyethylene naphthalate, polypropylene, cycloolefin polymer, polyamide, polyethersulfone, polymethylmethacrylate, polycarbonate and polyarylate, a glass material such as quartz glass and soda glass, and the like; a substrate formed of a ceramic material such as alumina; a substrate formed from a metal substrate such as stainless steel having a surface on which an oxide film (insulation film) is formed; and an opaque substrate such as a substrate formed of an opaque resin material.

An average thickness of such a substrate 2 is not particularly limited, but is preferably in the range of about 0.1 to 10 mm, and more preferably in the range of about 0.1 to 5 mm.

The cathode 3 is an electrode which injects electrons into the intermediate layer 4 described later.

Normally, as a constituent material of the cathode 3, materials having a low work function are selected from the viewpoint of its function that injects electrons into the light emitting layer 5. However, in the light emitting device 1 of the present invention, the intermediate layer 4 having a structure described later is provided between the cathode 3 and the light emitting layer 5.

Therefore, if both the cathode 3 and the intermediate layer 4 are constituted of metallic materials, transfer of electrons from the cathode 3 to the intermediate layer 4 can be carried out between metal atoms of the metallic materials. This means that even when materials having a high work function are used as the constituent material of the cathode 3, it is possible to inject the electrons from the cathode 3 to the intermediate layer 4 smoothly.

Examples of such materials having a low work function that can be used as the constituent material of the cathode 3 include thermal decomposition products of cesium oxide or cesium carbonate, Na, Li, Ca, Mg, Sr, La, Ce, Er, Eu, Sc, Y, Yb, Ag, Cu, Al, Cs, Rb, and alloys containing two or more of them, and the like.

Further, examples of such materials having a high work function that can be used as the constituent material of the cathode 3 include: conductive metal oxides such as ITO (Indium Tin Oxide), IZO (Indium Zinc Oxide), $In_2O_3$, $SnO_2$, $SnO_2$ containing Sb, ZnO containing Al, and the like; metals such as Au, Pt, Ag, Cu, and alloys containing two or more of them, and the like; and carbon based materials such as conductive diamond, and the like. Two or more of these materials may be used in combination.

Among the constituent materials that can be used for the cathode 3 mentioned above (hereinafter, referred to as "cathode material"), it is especially preferred to use the conductive metal oxides. Since the conductive metal oxides have especially excellent stability and conductivity with respect to oxygen, moisture, or the like, it is possible to inject the electrons from the cathode 3 to the intermediate layer 4 reliably.

In this regard, in the case where the light emitting device is formed into the bottom emission type, materials having substantially transparency are used as a constituent material of the cathode 3.

In other words, conductive metal oxides having substantially transparency are selected as a constituent material of the cathode 3. This makes it possible to emit light from the light emitting layer 5 to the side of the substrate 2 reliably.

An average thickness of such a cathode 3 is not particularly limited, but is preferably in the range of about 100 to 500 nm, and more preferably in the range of about 50 to 150 nm. If the thickness of the cathode 3 is too thin, resistivity becomes high and therefore voltage drop is caused, so that there is a fear that a function of the cathode 3 will not be sufficiently exhibited.

On the other hand, if the cathode 3 is too thick, in the case where the light emitting device 1 is formed into the bottom emission type, there is a fear that the light transmittance will be significantly lowered, thus resulting in the light emitting device 1 that is not suitable for practical use depending on, for example, the kind of cathode material used.

It is preferred that a surface resistance of the cathode 3 is as lower as possible. Specifically, it is preferably $50\Omega/\square$ or less, and more preferably $20\Omega/\square$ or less. Lower limit value of the surface resistance is not particularly limited, but normally it is preferably at about $0.1\Omega/\square$.

Now, as described above, the sealing member 8 is provided on or around the light emitting device 1 so as to seal it as shown in FIG. 1. The sealing member 8 is provided in order to suppress or prevent the cathode 3 from deteriorating or making alteration since in general the materials having the low work function used in the cathode 8 are materials that are easily to be oxidized.

Therefore, in the case where the cathode 3 is constituted of materials having properties that are relatively stable against oxygen or moisture such as the conductive metal oxides, the formation of the sealing member 8 may be omitted.

This makes it possible to reduce the size of the light emitting device and the production cost thereof. Further, in the case where the substrate 2 is constituted of materials having flexibility, the light emitting device 1 having the flexibility can be obtained. In this regard, it is to be noted that a constituent material of the sealing member 8 will be set forth later in more detail.

On the other hand, the anode 7 is an electrode which injects holes into the hole transport layer 6 described later. Materials having a high work function and excellent conductivity are preferably used as a constituent material of the anode 7 (hereinafter, referred to as "anode material"). This makes it possible to transfer holes from the anode 7 to the hole transport layer 6 smoothly.

As a constituent material of the anode 7, materials having a high work function are preferably used. These materials can be selected from the constituent materials mentioned above with reference to the constituent materials of the cathode 3.

An average thickness of the anode 7 is not limited to any specific value, but is preferably in the range of about 10 to 200 nm, and more preferably in the range of about 50 to 150 nm. If the thickness of the anode 7 is too thin, there is a fear that a function of the anode 7 will not be sufficiently exhibited. On the other hand, if the anode 7 is too thick, there is a fear that the luminous efficiency of the light emitting device 1 will be significantly lowered.

As is the same with the cathode 3, it is preferred that a surface resistance of the anode 7 is as lower as possible. Specifically, it is preferably $50\Omega/\square$ or less, and more preferably $20\Omega/\square$ or less. Lower limit value of the surface resistance is not particularly limited, but normally it is preferably at about $0.1\Omega/\square$.

As described above, the laminated layers 9 are provided between the cathode 3 and the anode 7 in contact with them, respectively. The laminated layers 9 include the intermediate layer 4, the light emitting layer 5 and the hole transport layer 6 which are laminated in this order from the side of the cathode 3.

The intermediate layer 4 has a function of transporting holes, which are injected from the cathode 3, to the light emitting layer 5. The feature of the light emitting device 1 of the present invention resides in the structure of the intermediate layer 4.

Namely, as shown in FIG. 3, the intermediate layer 4 includes a base (base layer) 41 constituted of at least one metal oxide based semiconductor material as a main component thereof and formed into a porous structure having many pores 4a defined by inner surfaces, and a dye 42 carried on a surface (upper surface) of the base layer 41 on the side of the light emitting layer 5 as well as the inner surfaces of the pores 4a so that the dye 42 is in contact with the light emitting layer 5.

In this regard, it is to be noted that since the cathode 3 and the base 41 are constituted of inorganic materials as a main component thereof, the base 41 exhibits excellent adhesion to the cathode 3. This makes it possible to reduce resistance at the vicinity of the boundary between the cathode 3 and the base 41, and thereby it is possible to inject electrons from the cathode 3 to the base 41 smoothly.

Since the dye 42 is carried on the surface of the base 41 on the side of the light emitting layer 5, it is possible to transfer the electrons, which are injected into the base 41, to the dye 42 smoothly.

Further, since the dye 42 and the light emitting layer 5 are in contact with each other and they are constituted of organic materials as a main component thereof, the dye 42 exhibits the excellent adhesion to the light emitting layer 5. This makes it possible to inject the electrons from the dye 42 to the light emitting layer 5 smoothly.

As described above, by providing the intermediate layer 4 having such a structure between the cathode 3 and the light emitting layer 5, the intermediate layer 4 exhibits the excellent adhesion to the cathode 3 and the light emitting layer 5. As a result, it becomes possible to transport the electrons, which are injected from the cathode 3, to the light emitting layer 5 smoothly.

As shown in FIG. 2 and FIG. 3, the base 41 may be formed into a dense structure, but it is preferred that the base 41 is formed into a porous structure having many pores 4a defined by inner surfaces. This makes it possible to carry the dye 42 (that is, the very fine particles constituting the dye 42) on the upper surface of the base 41, that is, a surface of the intermediate layer 4 in contact with the light emitting layer 5 as well as the inner surfaces of the pores 4a, so that it is possible to increase an amount of the dye 42 to be carried by the intermediate layer 4. Further, this also makes it possible for the material of the light emitting layer 5 to enter into the pores 4a.

For these reasons, it is possible to increase a contact area between the dye 42 and the base 41 and between the dye 42 and the light emitting layer 5, thereby improving adhesion between the intermediate layer 4 and the light emitting layer 5. Further, it is also possible to transfer the electrons from the base 41 to the light emitting layer 5, that is, from the intermediate layer 4 to the light emitting layer 5 through the dye 42 smoothly.

As shown in FIG. 2, the pores 4a may exist in the base 41 uniformly, but it is preferred that the pores 4a exist in the base 41 in an unevenly distributed manner on the upper side of the base 41, that is, the side of the base 41 adjacent to the light emitting layer 5 in a thickness direction thereof.

That is to say, it is preferred that porosity of the upper side (light emitting layer side) of the base 41 is higher than the porosity of the lower side (cathode side) of the base 41 which is adjacent to the cathode 3 in the thickness direction thereof.

By providing the pores 4a in the base 41 as described above, it is possible to provide a high existence ratio of the constituent material of the light emitting layer 5 and the dye 42 and a low existence ratio of the metal oxide based semiconductor material (constituting the base 41) in the upper side (light emitting layer side) of the base 41.

Further, it is also possible to provide a high existence ratio of the metal oxide based semiconductor material and a low existence ratio of the constituent material of the light emitting layer 5 and the dye 42 in the lower side (cathode side) of the base 41.

As a result, it is possible to efficiently transfer the electrons from the dye 42 to the light emitting layer 5 in the upper side of the base 41 as well as from the cathode 3 to the metal oxide based semiconductor material (constituting the base 41) in the lower side of the base 41.

According to the base 41 having the above structure, since the lower side of the base 41 is formed into dense, it is possible to prevent a part of the constituent material of the light emitting layer 5 from making contact with the cathode 3 reliably.

This makes it possible to prevent difference in the injection efficiency of the electrons from being caused between the cathode 3 and the intermediate layer 4 and between the cathode 3 and the light emitting layer 5. As a result, it is possible to prevent color heterogeneity from occurring in the light emitting device 1 reliably.

An average porosity of the pores 4a of the base 41 is preferably as large as possible as long as mechanical strength (film strength) of the base 41 does not decrease greatly. Specifically, the average porosity is preferably in the rage of about 20 to 60%, and more preferably in the range of about 30 to 50%.

This makes it possible to make the surface area of the inner surfaces of the pores 4a larger while preventing the mechanical strength of the base 41 from being lowered. As a result, it is possible to allow a large number of the fine particles constituting the dye 42 adhere to the inner surfaces of the pores 4a. Further, it is also possible to enter a large amount of the constituent material of the light emitting layer 5 into the pores 4a.

The metal oxide based semiconductor material is not particularly limited, but metal oxide based semiconductor material that has excellent hole transport ability and are capable of carrying the dye 42 thereon are preferably used.

Examples of such a metal oxide based semiconductor material include zinc oxide (ZnO), cadmium oxide (CdO), tin oxide ($SnO_2$), $ScVO_4$, $YVO_4$, $LaVO_4$, $NdVO_4$, $EuVO_4$, $GdVO_4$, $ScNbO_4$, $ScTaO_4$, $YNbO_4$, $YTaO_4$, $ScPO_4$, $ScAsO_4$, $ScSbO_4$, $ScBiO_4$, $YPO_4$, $YSbO_4$, $BVO_4$, $AlVO_4$, $GaVO_4$, $InVO_4$, $TlVO_4$, $InNbO_4$, and $InTaO_4$. These metal oxide based semiconductor material may be used singly or in combination of two or more of them.

Among these metal oxide based semiconductor material mentioned above, it is especially preferred that the metal oxide based semiconductor material is constituted of at least one of the zinc oxide and the cadmium oxide as a main component thereof. This is because both the zinc oxide and the cadmium oxide exhibit superior hole transport ability and have superior adhesion to the dye 42 (that is, the very fine particles constituting the dye 42).

Further, the dye 42 is not particularly limited to specific types, and various types of dye may be employed for the dye 42 if they have excellent electron transport ability and they are capable of being carried on the base 41. For example, it is preferred that the dye 42 is constituted of at least one of a coupling polycyclic dye and a fused polycyclic dye as a main component thereof.

This is because both the coupling polycyclic dye and the fused polycyclic dye exhibit especially superior electron transport ability because of a large number of bonds of the conjugated system being contained in the molecular structure thereof and they are capable of exhibiting superior affinity with respect to the metal oxide based semiconductor material.

Examples of such a coupling polycyclic dye include tetra-thiofulvalene, coumarin 6, rubrene, 1,1,4,4-tetraphenyl-1,3-butadiene, 2-(4-tert-butylphenyl)-5-(4-biphenyl)-1,3,4-oxadiazol, 2,5-bis(1-naphtyl)-1,3,4-oxadiazol, 3-(4-biphenyl)-4-phenyl-5-(4-tert-butylphenyl)-1,3,4-triazol, 1,3-bis[5-(p-4-tert-butylphenyl)-1,3,4-oxadiazol-2-yl]benzene, and the like as represented the following chemical formulas (1) to (8). These coupling polycyclic dyes exhibit such properties as described above more conspicuously.

(1) Tetra-Thiofulvalene

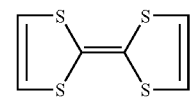

(1)

(2) Coumarin 6

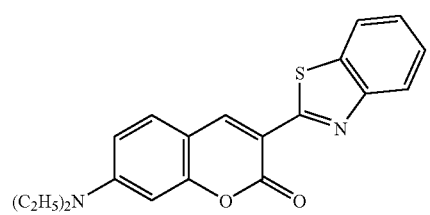

(2)

(3) Rubrene

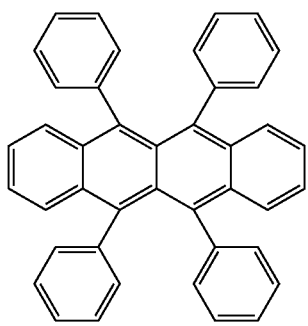

(4) 1, 1, 4, 4-Tetraphenyl-1, 3-Butadiene (TPB)

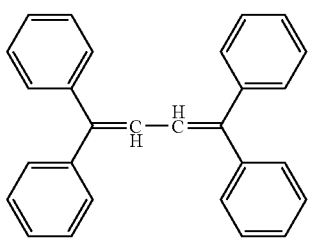

(5) 2-(4-Tert-Butylphenyl)-5-(4-Biphenyl)-1, 3, 4-Oxadiazol (PBD)

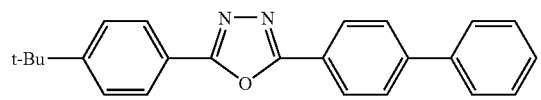

(6) 2, 5-Bis(1-Naphtyl)-1, 3, 4-Oxadiazol (BND)

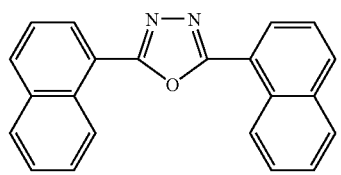

(7) 3-(4-Biphenyl)-4-Phenyl-5-(4-Tert-Butylphenyl)-1, 3, 4-Triazol (BND)

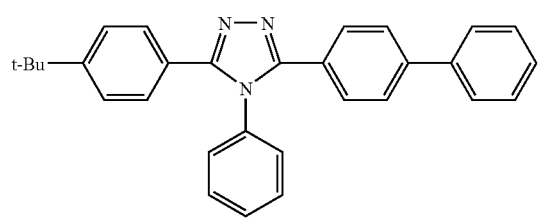

(8) 1, 3-Bis[5-(p-4-Tert-Butylphenyl)-1, 3, 4-Oxadiazol-2-Yl] Benzene (BND)

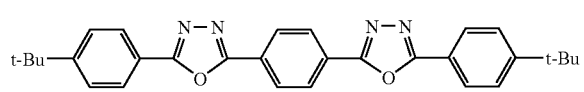

Examples of the fused polycyclic dye include coumarin 343, Nile red, perylene, quinacridone, N,N'-dimethylquinacridone, and the like as represented the following chemical formulas (9) to (13). These fused polycyclic dyes exhibit such properties as described above conspicuously.

(9) Coumarin 343

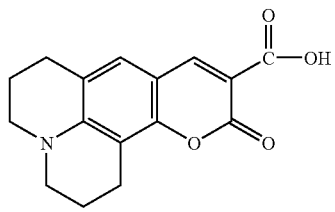

(10) Nile red

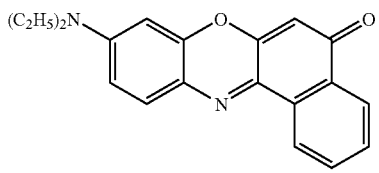

(11) Perylene

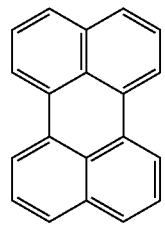

(12) Quinacridone

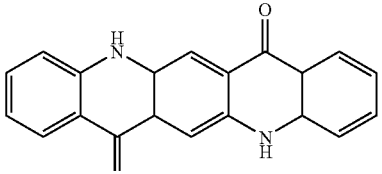

(13) N, N'-Dimethylquinacridone

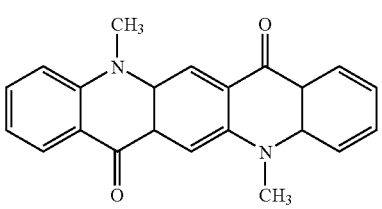

An amount of the dye 42 to be carried on to the base 41 is not limited to any specific value, but is preferably in the range of about $1 \times 10^{-11}$ to $1 \times 10^{-8}$ mol per 1 cm² of the intermediate layer 4, and more preferably in the range of about $1 \times 10^{-10}$ to $1 \times 10^{-9}$ mol per 1 cm² of the intermediate layer 4.

When the dye 42 of such an amount is carried on the base 41, it is possible to enhance the adhesion between the dye 42 and the light emitting layer 5, that is, the adhesion between the intermediate layer 4 and the light emitting layer 5, and therefore it is possible to transfer the electrons from the intermediate layer 4 to the light emitting layer 5 smoothly. As a result, the light emitting device 1 exhibits superior luminous efficiency.

An average thickness of such an intermediate layer 4 is not limited to any specific value, but is preferably in the range of about 1 to 500 nm, and more preferably in the range of about 5 to 100 nm. This makes it possible to transfer the electrons from the cathode 3 to the light emitting layer 5 through the intermediate layer 4 reliably. This also makes it possible to reduce thickness of the light emitting device 1.

The hole transport layer 6 has a function of transporting holes, which are injected from the anode 7, to the light emitting layer 5.

Although various materials can be used as a constituent material of the hole transport layer 6, conjugated compounds having basic structures comprised of various low molecular hole transport materials or various high molecular hole transport materials mentioned below are preferably used. Such conjugated compounds can transport holes especially smoothly due to a characteristic derived from its unique spread of the electron cloud, and therefore such compounds can have especially excellent hole transport ability.

In this regard, it is to be noted that in the case where low molecular hole transport materials are used for the constituent material of the hole transport layer 6, a dense hole transport layer 6 can be obtained, so that hole transport efficiency of the hole transport layer 6 can be improved.

On the other hand, in the case where high molecular hole transport materials are used for the constituent material of the hole transport layer 6, the hole transport layer 6 can be formed using various application methods such as an ink-jet printing method, a spin coating method, and the like, since such high molecular hole transport materials are dissolved in a solvent relatively easily.

Further, in the case where the low molecular hole transport materials are used in combination with the high molecular hole transport materials, it is possible to obtain a synergistic effect that a dense hole transport layer 6 having the excellent hole transport efficiency can be formed relatively easily using various application methods such as an ink-jet printing method, and the like.

Examples of such low molecular hole transport materials include arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine (α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine (cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly(thiophenevinylene); pyrrole-based compounds such as poly(2,2'-thienylpyrrole), and 1,4-dithioketo-3,6-diphenyl-pyrrolo-(3,4-c)pyrrolopyrrole; florene-based compounds such as florene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. These materials may be employed singly or in combination of two or more of them. All of these materials have high hole transport ability.

Examples of the high molecular hole transport materials include (1) a polymer or a prepolymer which can be obtained by polymerizing a monomer having any one of the low molecular hole transport materials mentioned above in a main chain or a side chain thereof, and (2) a polymer or a prepolymer which can be obtained by polymerizing an oligomer having any one of the low molecular hole transport materials in a main chain or a side chain thereof, and the like.

Furthermore, as other high molecular hole transport materials, it is possible to use poly(thiophene/styrenesulfonic acid)-based compounds such as poly(3,4-ethylenedioxythiophene/styrenesulfonic acid) (PEDOT/PSS) and the like. These compounds also have higher hole transport ability.

An average thickness of the hole transport layer 6 is not limited to any specific value, but it is preferably in the range of about 10 to 150 nm, and more preferably in the range of about 50 to 100 nm. If the thickness of the hole transport layer 6 is too thin, there is a fear that pin holes are to be formed. On the other hand, if the thickness of the hole transport layer 6 is too thick, it may result in reduced transmittance of the hole transport layer 6, thus leading to the case where chromaticity (hue) of emitted light is adversely changed.

When current flows between the cathode 3 and the anode 7 (that is, voltage is applied across the cathode 3 and the anode 7), electrons move in the light emitting layer 5 through the intermediate layer 4 and holes move in the hole transport layer 6 and therefore excitons (exciters) are produced mainly at the vicinity of the boundary between the hole transport layer 6 and the light emitting layer 5 through the combining process of the holes and the electrons.

The excitons are recombined in a certain period of time. At that time, excitation energy accumulated in the process of the production of the excitons is released as light such as fluorescence, phosphorescence, or the like. This is electroluminescence emission.

As a constituent material (hereinafter, refer to as "light emitting material") of the light emitting layer 5, various materials can be used if, by using such materials, electrons are injected into the light emitting layer 5 from the side of the cathode 3 and the holes are injected into the light emitting layer 5 from the side of the anode 7 when a voltage is applied across the anode 7 and the cathode 3 to thereby provide a field in which the holes and the electrons can be recombined.

As such a light emitting material, there are various low molecular type light emitting materials and various high molecular type light emitting materials as mentioned hereinbelow, and at least one of these materials can be used.

In this regard, it is to be noted that when the low molecular type light emitting materials are used, a dense light emitting layer 5 can be obtained, thereby enabling the luminous efficiency of the light emitting layer 5 to be increased. On the other hand, when the high molecular type light emitting materials are used, it is possible to form the light emitting layer 5 easily using any one of various application methods such as an ink-jet printing method and the like since such materials are dissolved into a solvent relatively easily.

Further, when the low molecular type light emitting materials are used in combination with the high molecular type light emitting materials, it is possible to obtain a synergistic effect of both the low molecular type light emitting materials and the high molecular type light emitting materials. That is to say, it is possible to obtain an effect that a dense light emitting layer 5 having the high luminous efficiency can be easily formed by using various application methods such as an ink-jet printing method and the like.

Examples of such low molecular type light emitting materials include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-dicarboxylmide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; florene-based compounds such as florene; various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium(III) ($Eu(TTA)_3$ (phen)), fac-tris(2-phenylpyridine) iridium ($Ir(ppy)_3$), and (2,3,7,8,12,13,17,18-octaethyl-21H,23H-porphin) platinum (II), and the like.

Examples of such high molecular type light emitting materials include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly (3-alkylthiophene) (PAT), and poly(oxypropylene)triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6am4), poly(9,9-dioctyl-2,7-divinylenefluorenyl)-ortho-co(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

An average thickness of the light emitting layer 5 is not limited to any specific value, but is preferably in the range of about 10 to 150 nm, and more preferably in the range of about 50 to 100 nm. By setting the thickness of the light emitting layer 5 to a value within the above range, the recombination of the holes and the electrons efficiently occurs, thereby enabling the luminous efficiency of the light emitting layer 5 to be further improved.

In this regard, it is to be noted that the light emitting layer 5 is not limited to a single layer as described with reference to the above described embodiment. For example, the light emitting layer 5 may be formed into a multilayer structure in which an electron transport layer having excellent electron transport ability is provided in the light emitting layer 5 in contact with the intermediate layer 4.

The light emitting layer 5 having such a structure makes it possible to more increase the electron transport ability of the light emitting layers.

Examples of materials (electron transport materials) that can be used for the electron transport layer 6 are not particularly limited, but include: benzene-based compounds (starburst-based compounds) such as 1,3,5-tris[(3-phenyl-6-trifluoromethyl)quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used at least one of them.

The sealing member 8 is provided so as to cover the cathode 3, the intermediate layer 4, the light emitting layer 5, the hole transport layer 6, and the anode 7. In this way, the sealing member 8 has a function of hermetically sealing these layers and shutting off oxygen and moisture.

By providing such a sealing member 8, it is possible to suppress or prevent the oxidation of the cathode 3 from being oxidized, so that it is possible to obtain the effects that improve the reliability of the light emitting device 1 or prevent the light emitting device 1 from deteriorating or making alteration (that is, the light emitting device 1 can have improved durability).

Examples of a constituent material of the sealing member 8 include Al, Au, Cr, Nb, Ta and Ti, alloys containing them, silicon oxide, various resin materials, and the like.

Further, the sealing member 8 may be formed into a flat plate shape, and provided so as to face the substrate 2 so that a space is created between the sealing member 8 and around the layers, and then the space is filled with a seal material such as thermosetting resin or the like to thereby seal the light emitting device 1.

As described above, in the case where the cathode 3 is constituted of a material such as conductive metal oxides having characteristics that are relatively stable with respect to the oxygen or the moisture, the formation of the sealing member 8 may be omitted.

In this light emitting device 1, when a voltage of 0.5 V is applied across the cathode 3 and the anode 7 so that the cathode 3 is negative and the anode 7 is positive, it is preferred that the light emitting device 1 has a characteristic that a resistance value is preferably $100\Omega/cm^2$ or more, and more preferably $1 k\Omega/cm^2$ or more.

The characteristic of the light emitting device 1 described above means that short circuit (leakage of current) between the cathode 3 and the anode 7 is appropriately prevented or suppressed. Therefore, a light emitting device having such a characteristic can have especially high luminous efficiency.

Such a light emitting device 1 can be manufactured as follows.

<1A> Step of Forming a Cathode

First, a substrate 2 is prepared, and then a cathode 3 is formed on the substrate 2.

The cathode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

<2A> Step of Forming an Intermediate Layer

Next, an intermediate layer 4 is formed on the cathode 3.

The intermediate layer 4 is formed by forming a porous base 41 on the cathode 3, and then fine particles constituting the dye 42 are carried (allowed to adhere) on the base 41 as well as the inner surfaces 4a of the pores 4a of the base 41 to form the intermediate layer 4.

In this regard, examples of a method for forming the porous base 41 include: [I] a method in which a plating layer is formed on the cathode 3 by using a plating solution containing at least one organic compound and at least one metal oxide semiconductor material, and then the organic compound is removed from the plating layer; [II] a method in which a liquid material containing at least one metal oxide based semiconductor material is supplied on the cathode 3, and then the liquid component contained in the liquid material is removed, thereafter sintering it.

Among these methods mentioned above, the method [I] is preferably used. According to the method [I], fine pores 4a can be easily formed with controlling the size of the pores 4a which are to be formed in the porous base 41.

Hereinafter, description will be made, as a representative, the case where the base 41 is formed by using the method [I], thereby forming the intermediate layer 4.

<2A-1> First, a plating solution which is obtained by dissolving or dispersing an organic compound in a solution containing a metal ion of a metal contained in a metal oxide based semiconductor material and a chloride ion.

As the solution containing the metal ion and the chloride ion, it is possible to employ (1) a solution in which a metal chloride which serves as an ion source of the metal ion and the chloride ion are contained and/or (2) a solution obtained by mixing a solution in which a water-soluble metal salt which serves as an ion source of the metal ion is contained and a solution in which hydrochloric acid or a salt of water-soluble chloride which serves as a source of the chloride ion is contained.

Examples of the metal salt include a metal nitrate salt, a metal sulfate salt, a metal phosphate, and the like.

Examples of the chloride include potassium chloride, sodium chloride, lithium chloride, ammonium chloride, and the like.

A concentration of the metal ion in the plating solution is preferably in the range of about 0.01 to 0.5 mol/L, and more preferably in the range of about 0.1 to 0.3 mol/L.

A concentration of the chloride ion in the plating solution is preferably in the range of about 0.01 to 0.5 mol/L, and more preferably in the range of about 0.1 to 0.3 mol/L.

If the concentrations of the metal ion and the chloride ion fall within the above-noted ranges, it is possible to precipitate the metal oxide based semiconductor material on the cathode 3 in the next step <2A-2> reliably.

It is preferred that the organic compound to be dissolved or dispersed in the plating solution is of the type that can be precipitated and then deposited on the cathode 3 together with the metal oxide based semiconductor material to form a plating layer in the next step <2A-2>, and that can be removed or eluted from the plating layer without eluting the metal oxide based semiconductor material from the plating layer in the next step <2A-3>.

Examples of such an organic compound to be used include an organic compound having 9-phenylxanthene skeleton represented by the following general formula (14) and an organic compound having diphenylmethane skeleton represented by the following general formula (15).

Since these organic compounds are precipitated at a uniform ratio with the metal oxide based semiconductor material in the next step <2A-2>, it is possible to form pores 4a in a base 41 uniformly.

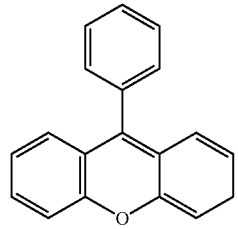

(14)

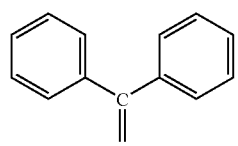

(15)

The organic compound having the 9-phenylxanthene skeleton is not particularly limited, but examples of the organic compound include 2',4',5',7'-tetrabromofluorescein-disodium salt (acid red 87), fluorescein-disodium salt, rhodamine B, erythrosine, and the like, which are represented in the following general formulas (16) to (19).

Use of such an organic compound mentioned above makes it possible to obtain the effects as described above reliably.

(16) 2', 4', 5', 7'-Tetrabromofluorescein-Disodium Salt (Acid Red 87)

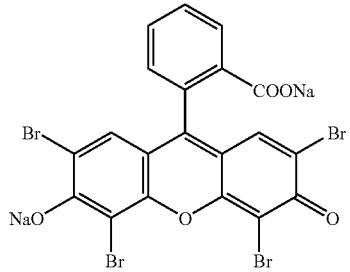

(16)

(17) Fluorescein-Disodium Salt

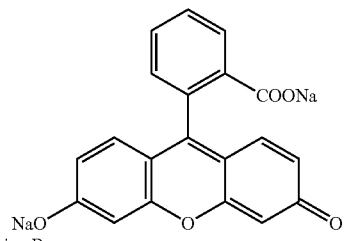

(17)

(18) Rhodamine B

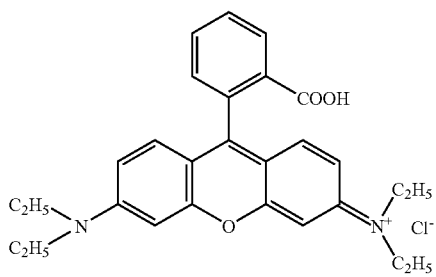

(18)

(19) Erythrosine

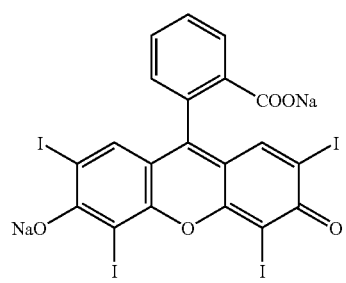

(19)

The organic compound having the diphenylmethane skeleton is not particularly limited, but examples of the organic compound include crystal violet, malachite green, auramine O, and the like, which are represented by the following general formulas (20) to (22). Use of such organic compound mentioned above also makes it possible to obtain the effects as described above reliably.

(20) Crystal Violet

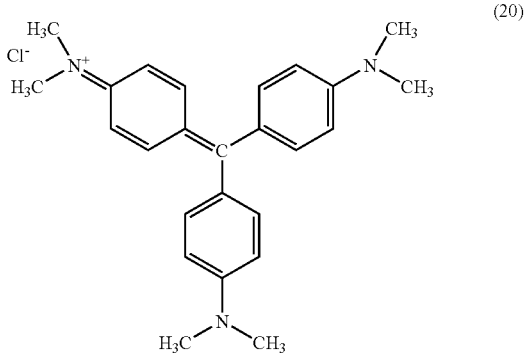

(20)

(21) Malachite Green

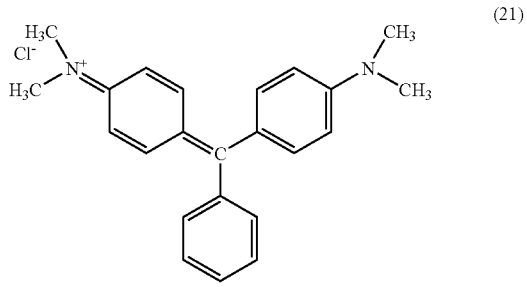

(21)

(22) Auramine O

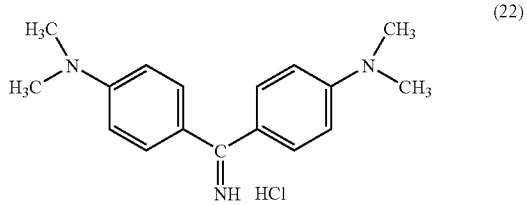

(22)

A concentration of the organic compound contained in the plating solution varies slightly depending on kinds of organic compound to be used, but is preferably in the range of about 0.01 to 0.5 mmol/L, and more preferably in the range of about 0.1 to 0.3 mmol/L. This makes it possible to form the pores 4a in the next step <2A-3> reliably.

<2A-2> Next, the cathode 3 as a negative electrode and a metal plate which is constituted of a metal contained in the metal oxide based semiconductor material and serves as an anode are set in the plating solution, and then a voltage is applied across the cathode 3 and the anode while supplying oxygen gas into the plating solution with a state that the cathode 3 and the metal plate (anode) are being dipped in the plating solution.

In this way, the metal oxide based semiconductor material is precipitated together with the organic compound and then deposited on the cathode 3, thereby a plating layer constituted of the metal oxide based semiconductor material and the organic compound as main materials thereof is formed on the cathode 3.

The applied voltage in the cathode 3 may be appropriately set according to the concentration of the metal ion, chloride ion, and the like in the plating solution, but is preferably in the range of about −0.2 to −2.0 V, and more preferably in the range of about −0.7 to 1.4 V by conversion of hydrogen reduction potential. This makes it possible to perform control of the thickness of the plating layer relatively easily with forming the plating layer on the cathode 3 reliably.

The flow rate of the oxygen gas is preferably in the range of about 0.05 to 100 sccm per 1 $cm^2$ of the plated surface of the cathode 3, and more preferably in the range of about 0.5 to 30 sccm per 1 $cm^2$ of the plated surface of the cathode 3. This makes it possible to precipitate the metal oxide based semiconductor material on the cathode 3 reliably.

The temperature of the plating solution is preferably in the range of about 20 to 90° C., and more preferably in the range of about 50 to 80° C.

The pH of the plating solution is preferably in the range of about 1.0 to 7.0, and more preferably in the range of about 4.0 to 6.0.

If the temperature and the pH of the plating solution fall within the above-noted ranges, it is possible to reliably form the plating layer which is constituted of the metal oxide based semiconductor material and the organic compound as main components thereof on the cathode 3.

In this regard, it is to be noted that a relation between the average porosity of the pores 4a of the obtained base 41 and a kind or concentration of the selected organic compound and the selected metal ion can be known beforehand by an experiment.

In the case where the base 41 is to be formed into a dense structure, this can be achieved by omitting the addition of the organic compound into the plating solution in the <2A-1> step. This makes it possible to form a dense plating layer which is constituted of the metal oxide based semiconductor material as a main component thereof, namely, it is possible to form a dense base 41 which does not contain any organic compound.

Further, in order to form the base 41 in which pores 4a exist in the base 41 in an unevenly distributed manner to the upper side of the base 41 adjacent to the light emitting layer 5, an abundance ratio between the concentration of the organic compound and the concentration of the metal ion in the plating solution may be changed so that the ratio of the concentration of the organic compound is increased in the process of the formation of the plating layer.

For example, this can be achieved by adding the organic compound additionally into the plating solution on the way of the forming process of the plating layer.

<2A-3> Next, the plating layer formed on the cathode 3 is dipped in an alkali solution.

This makes it possible to elute (remove) the organic compound from the plating layer, so that it is possible to obtain a base 41 in which a plurality of pores 4a are formed in an area of the base 41 where the organic compound has been existed.

The alkali solution is not particularly limited, but potassium hydroxide, sodium hydroxide, lithium hydroxide, cesium hydroxide, and the like can be preferably used.

The ph of the alkali solution is not limited to any specific value, but is preferably in the range of about 8.5 to 12.0, and more preferably in the range of about 9.5 to 10.5. This makes it possible to elute the organic compound from the plating layer reliably.

<2A-4> Next, the base 41 is washed by using a solvent such as ultrapure water, diethylether, hot ethanol, acetone, and isopropylalcohol, and then the solvent is removed.

This makes it possible to allow the fine particles constituting the dye 42 to be carried on the base 41 in the next step <2A-5> efficiently.

Examples of a method for removing the solvent include a method for heating, a method for drying in vacuum or under reduced pressure, and a method for blowing an inactivated gas, and the like. These methods may be used singly or in combination of two or more of them.

<2A-5> Next, a liquid material containing the dye 42 therein is supplied on the base 41, and then the liquid material is dried (to thereby remove the solvent).

In this way, the fine particles constituting the dye 42 are carried on the upper surface of the base 41 as well as the inner surfaces of the pores 4a, thereby obtaining an intermediate layer 4.

Examples of a method for supplying the liquid material containing the dye 42 on the base 41 include a method in which a layered structure formed from the substrate 2, the cathode 3, and the base 41 is dipped in the liquid material (dipping method), a method in which the liquid material is coated on the base 41 (coating method), a method in which the liquid material is supplied onto the base 41 with shower, and the like.

A concentration of the dye 42 in the liquid material varies depending on an amount of the dye 42 to be carried on the base 41, but is preferably in the range of about 0.01 to 0.5 mol/L, and more preferably in the range of about 0.1 to 0.3 mol/L.

The time that the liquid material is in contact with the base 41 varies slightly depending on the kind of a dye to be used, but is preferably in the range of about 1 to 30 minutes, and more preferably in the range of about 2 to 10 minutes.

If the conditions that the liquid material is in contact with the base 41 are set within the above-noted ranges, it is possible to allow the dye 42 to be carried on the base 41 reliably.

Examples of a solvent for preparing the liquid material include various waters, methanol, ethanol, isopropyl alcohol, acetonitrile, ethyl acetate, ether, dichloromethane, NMP (N-methyl-2-pyrrolidone), and the like. These solvents may be used singly or in combination of two or more of them.

Examples of a method for removing the solvent include a method in which the liquid material is placed or left in atmosphere pressure or under reduced pressure, a method in which the liquid material is blown with gas such as air, nitrogen gas, or the like.

It is to be noted that in the case where the dipping method or the coating method is used, the liquid material is preferably supplied onto the base 41 under reduced pressure. This makes it possible to reach the liquid material containing the dye 42 to the inner surfaces of the pores 4a reliably. As a result, it is possible to allow the fine particles constituting the dye 42 to be carried on the inner surfaces over the whole of the pores 4a formed in the base 41.

<3A> Step of Forming a Light Emitting Layer

Next, a light emitting layer 5 is formed on the intermediate layer 4.

The light emitting layer 5 can be obtained, for example, by supplying a light emitting material which is prepared by dissolving any one of the light emitting materials as described above in a solvent or dispersing any one of the light emitting materials as described above in a dispersion medium onto the intermediate layer 4, and then removing the solvent or the dispersion medium contained in the light emitting material.

By the same reasons as in the case to supply the liquid material onto the base 41 in the step <2A-5>, it is preferred that the light emitting material is supplied onto the intermediate layer 4 under reduced pressure. This makes it possible to reach the light emitting material over the whole of the pores 4a formed in the intermediate layer 4 reliably. As a result, it is possible to allow the light emitting layer 5 to be in contact with the dye 42 reliably and thereby it is possible to transfer a carrier (that is, electrons) from the intermediate layer 4 to the light emitting layer 5 smoothly.

Various methods can be used for supplying the light emitting material onto the intermediate layer 4. Examples of such methods include an ink-jet method, a spin coating method, a liquid source misted chemical deposition method (LSMCD method), a casting method, a micro gravure coating method, a gravure coating method, a bar coating method, a roll coating method, a wire-bar coating method, a dip coating method, a spray coating method, a screen printing method, a flexographic printing method, an offset printing method, a micro contact printing method, and the like, and these methods can be employed singly or in combination of two or more of them.

Examples of such a solvent or a dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g., hexane, pentane, heptane, and cyclohexane, aromatic hydrocarbon-based solvents e.g., toluene, xylene, tetramethylbenzene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

<4A> Step of Forming a Hole Transport Layer

Next, a hole transport layer 6 is formed on the light emitting layer 5.

The hole transport layer 6 can be formed using the same method described above with reference to the light emitting layer 5. In other words, the hole transport layer 6 can be formed by using the method as described above with reference to the step of forming the light emitting layer <3A> using any one or more of the hole transport materials described above.

<5A> Step of Forming an Anode

Next, an anode 7 is formed on the hole transport layer 6.

The anode 7 can be formed using the same method described above with reference to the step of forming the cathode <1A>.

<6A> Step of Forming a Sealing Member

Next, a sealing member 8 is formed so as to cover the cathode 3, the intermediate layer 4, the light emitting layer 5, the hole transport layer 6, and the anode 7.

The sealing member 8 may be formed (or provided) by bonding a box-shaped protective cover constituted of any one or more of the materials mentioned above onto the laminated body including these layers with a curable resin (adhesive).

As for such a curable resin, any of thermosetting resins, photocurable resins, reactive curable resins, or anaerobic curable resins may be used.

The light emitting device 1 is manufactured through the above steps.

In the present embodiment described above, an explanation was made with regard to the case in which the light emitting device 1 is manufactured by laminating the intermediate layer 4, the light emitting layer 5, the hole transport layer 6, and the anode 7 on the cathode 3 successively in this order. However, the present invention is not limited to such a case.

In other words, the light emitting device 1 may be manufactured by the following method. First, the intermediate layer 4 is formed on the cathode 3 to thereby prepare a first laminate body. Next, the hole transport layer 6 and the light emitting layer 5 are laminated on the anode 7 successively in this order to thereby prepare a second laminate body.

Thereafter, the first laminate body and the second laminate body are faced to each other in a state that the intermediate layer 4 is opposed to the light emitting layer 5, and then they are made contact with each other while being heated to join them together.

Second Embodiment

Next, description will be made on a second embodiment of the light emitting device according to the present invention.

Figure 4:
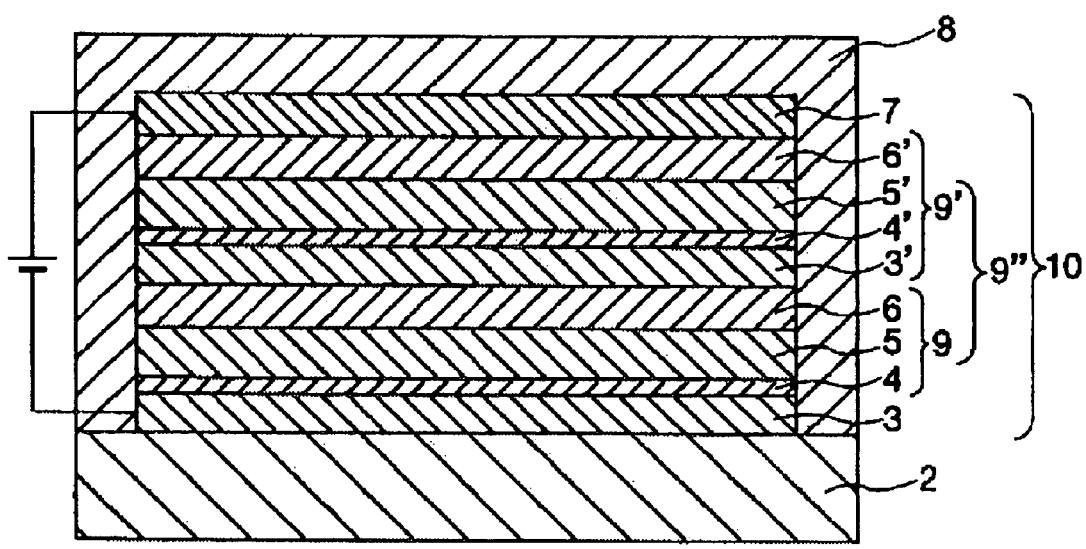
FIG. 4 is a vertical sectional view which shows a second embodiment of a light emitting device in accordance with the present invention.

FIG. 4 is a vertical section view which shows a second embodiment of a light emitting device in accordance with the present invention. In the following description, the upper side in FIG. 4 will be referred to as "upper" and the lower side thereof will be referred to as "lower".

In the following description, an explanation will be made by focusing on different points from the first embodiment and an explanation on the common points is omitted.

The light emitting device 1 of the second embodiment has the same structure as that of the light emitting device 1 of the first embodiment, except that the laminated layers 9, in which the intermediate layer 4, the light emitting layer 5, and the hole transport layer 6 are laminated between the cathode 3 and the anode 7 as the first embodiment, are changed into a laminated structure (laminated layers) 9" as shown in FIG. 2.

The laminated layers 9" has a structure in which another laminated layers 9' comprised of a transparent electrode 3', an intermediate layer 4', a light emitting layer 5', and a hole transport layer 6' are provided on the laminated layers 9 of the light emitting device 1 shown in FIG. 1. Namely, the laminated structure 9" has a structure in which the laminated layers 9 and the laminated layers 9' are arranged in up and down relation (coupled in series).

Hereinafter, description will be made with regard to the laminated layers 9".

The transparent electrode 3' is formed on the laminated layers 9, namely, on the hole transport layer 6.

The transparent electrode 3' is an electrode having functions of both injecting holes into the hole transport layer 6 and injecting electrons into the intermediate layer 4'.

In the case where the light emitting device 10 has a structure of a top emission type, light is emitted from the light emitting layer 5 to the side of the anode 7. Further, in the case where the light emitting device 10 has a structure of a bottom emission type, it is necessary that light is transmitted from the light emitting layer 5' to the side of the cathode 3 through the transparent electrode 3'.

Therefore, in the latter case, a constituent material to be used for the transparent electrode 3' is required to be substantially transparent (that is, transparent and colorless, colored and transparent, or translucent), and it is selected from the constituent materials of the cathode 3 described above.

Namely, examples of the constituent material of the transparent electrode 3' include transparent conductive metal oxides such as IZO (Indium Zinc Oxide), $In_3O_3$, $SnO_2$, $SnO_2$ containing Sb, ZnO containing Al, and the like. These materials may be used singly or in combination of two or more of them.

It is to be noted that the intermediate layer 4', the light emitting layer 5', and the hole transport layer 6' which are provided in the laminated layers 9' have the same structure as the intermediate layer 4, the light emitting layer 5, and the hole transport layer 6 which are provided in the laminated layers 9, respectively.

In this regard, each constituent material of the intermediate layer 4', the light emitting layer 5', and the hole transport layer 6' may be the same as each constituent material of the intermediate layer 4, the light emitting layer 5, and the hole transport layer 6, or they may be different from each other if the various constituent materials mentioned above with reference to the first embodiment are used.

Since such a structure of the light emitting device 10 described above makes it possible to obtain electroluminescence emission from two light emitting layers 5 and 5', it is possible to improve the luminous efficiency and emit the light stably.

The light emitting devices 1 and 10 as described hereinabove can be used as a light source and the like. Further, a plurality of the light emitting devices 1 and 10 can be applied to a display apparatus by arranging them in a matrix manner.

A drive system of a display apparatus is not particularly limited, but may be either of an active matrix type or a passive matrix type.

Electronic Device

Hereinbelow, description will be made based on one example where the electronic device provided with the light emitting device according to the present invention is applied to a display apparatus.

Figure 5:
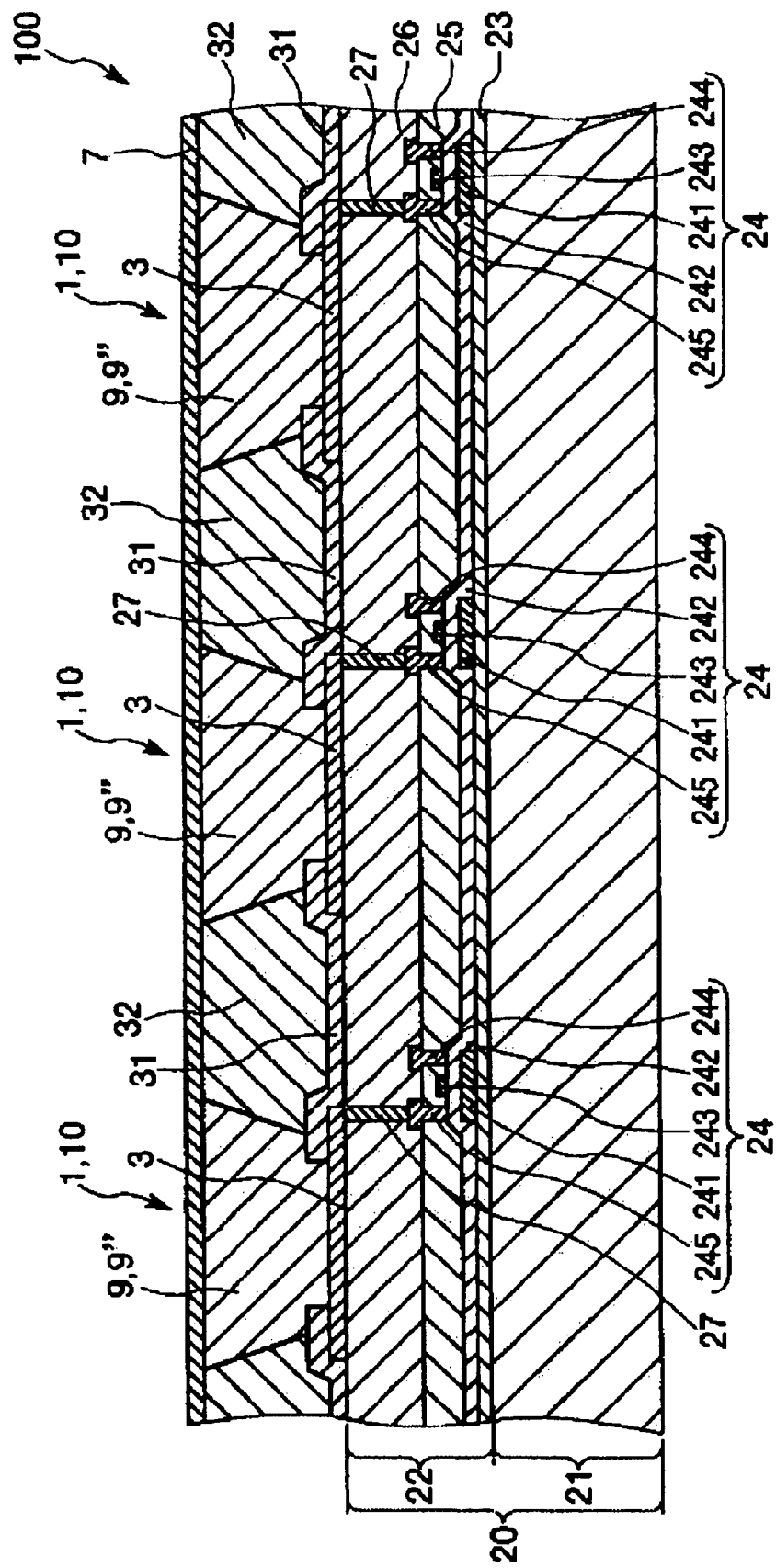
FIG. 5 is a vertical section view which shows an embodiment of a display apparatus provided with a light emitting device in accordance with the present invention.

FIG. 5 is a vertical section view which shows an embodiment of a display apparatus provided with the light emitting devices in accordance with the present invention.

As shown in FIG. 5, a display apparatus 100 includes a base 20 and a plurality of the light emitting devices 1 and 10 provided on the base 20.

The base 20 includes a substrate 21 and a circuit section 22 formed on the substrate 21.

The circuit section 22 includes a protective layer 23 provided on the substrate 21 and formed from a titanium oxide layer, driving TFTs (switching element) 24 formed on the protective layer 23, a first insulation layer 25, and a second insulation layer 26.

The driving TFTs 24 include semiconductor layers 241 made of a silicon, a gate insulation layer 242 formed on the semiconductor layers 241, gate electrodes 243 formed on the gate insulation layer 242, source electrodes 244, and drain electrodes 245.

The light emitting devices 1 and 10 are provided on the circuit section 22 having the above structure so as to be associated with the respective driving TFTs 24. Further, the adjacent light emitting devices 1 and 10 are partitioned by the first partitioning wall portions 31 and second partitioning wall portions 32.

In this embodiment, a cathode 3 of each of the light emitting devices 1 and 10 constitutes a pixel electrode, and it is electrically connected to the drain electrodes 245 of the corresponding driving TFTs 24 through the wirings 27. Further, the anode 7 of the respective light emitting devices 1 and 10 is formed into a common electrode.

Furthermore, a seal member (not shown in the drawing) is joined to the base 20 so as to cover the respective light emitting devices 1 and 10 to thereby seal the light emitting devices 1 and 10.

The display apparatus 100 may be formed into a single color display type, but the display apparatus 100 can be configured to display a color image by selecting light emitting materials used for the respective light emitting devices 1 and 10.

Electronic Equipment

The display apparatus 100 (electronic device of the present invention) described above can be used for various electronic equipment.

Figure 6:
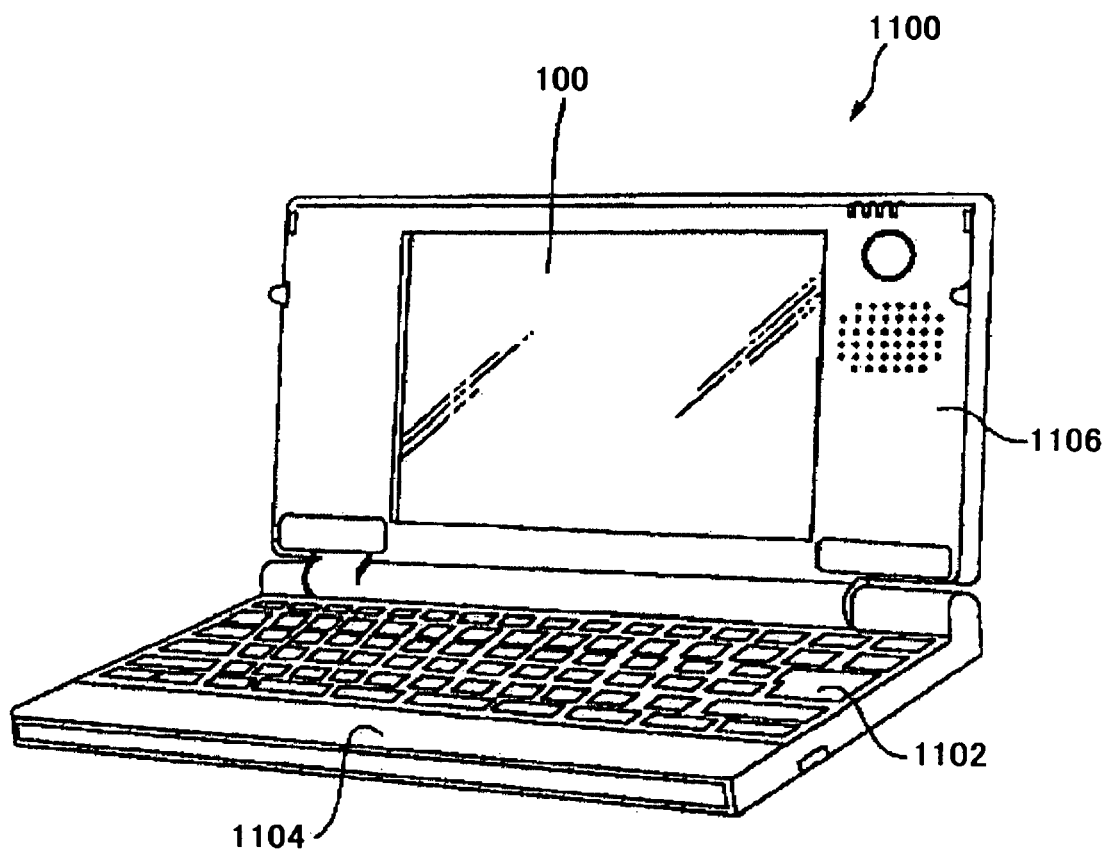
FIG. 6 is a perspective view which shows the structure of a personal mobile computer (or a personal notebook computer) which is one example of the electronic equipment according to the present invention.

FIG. 6 is a perspective view which shows the structure of a personal mobile computer (or a personal notebook computer) which is one example of the electronic equipment according to the present invention.

In FIG. 6, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display apparatus 100 described above.

Figure 7:
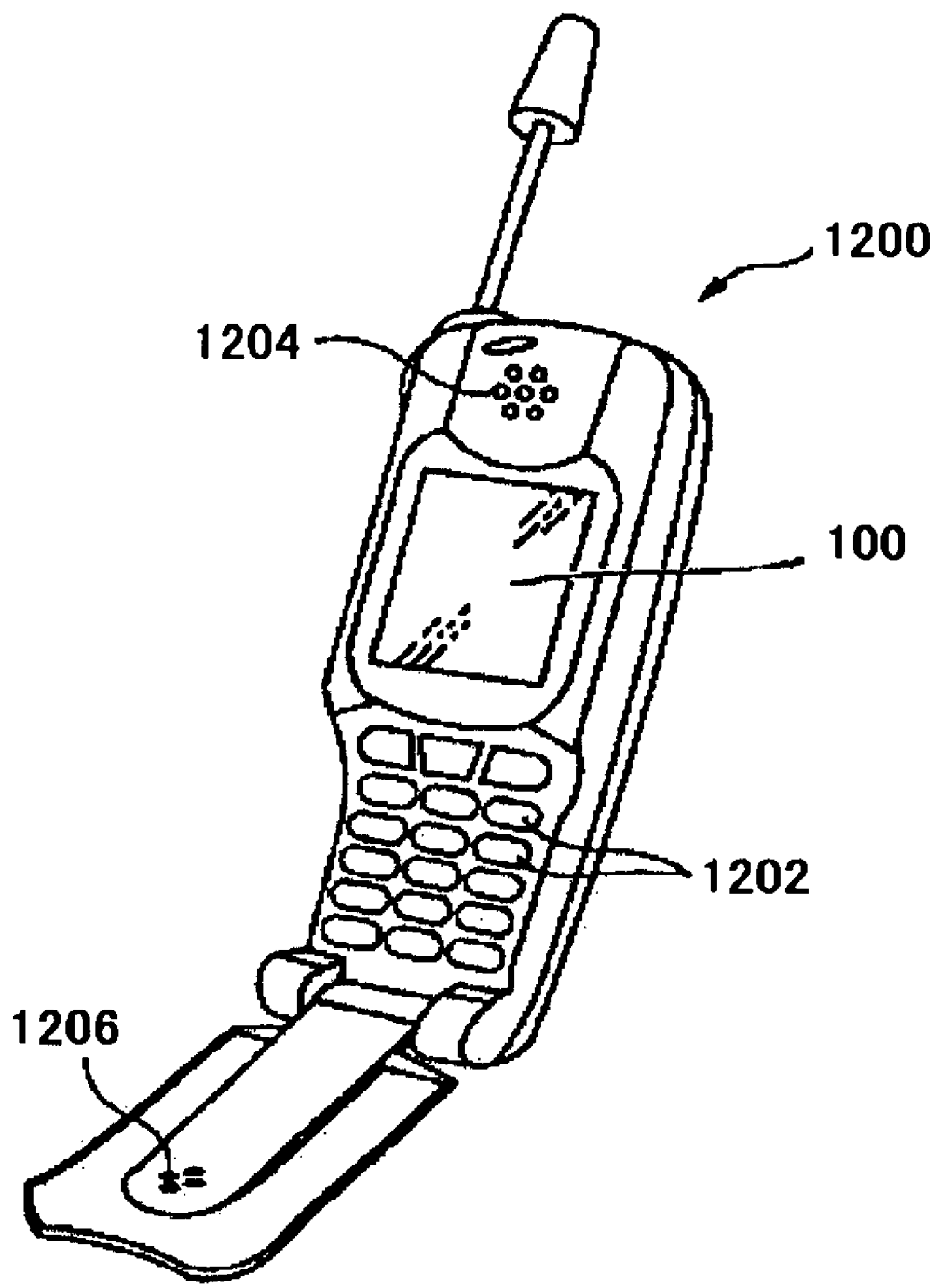
FIG. 7 is a perspective view which shows the structure of a mobile phone (including the personal handyphone system (PHS)) which is the other example of the electronic equipment according to the present invention.

FIG. 7 is a perspective view which shows the structure of a mobile phone (including the personal handyphone system (PHS)) which is the other example of the electronic equipment according to the present invention.

The mobile phone 1200 shown in FIG. 7 includes a plurality of operation buttons 1202, an earpiece 1204, a mouthpiece 1206, and a display.

In this mobile phone 1200, the display is constructed from the display apparatus 100 as described above.

Figure 8:
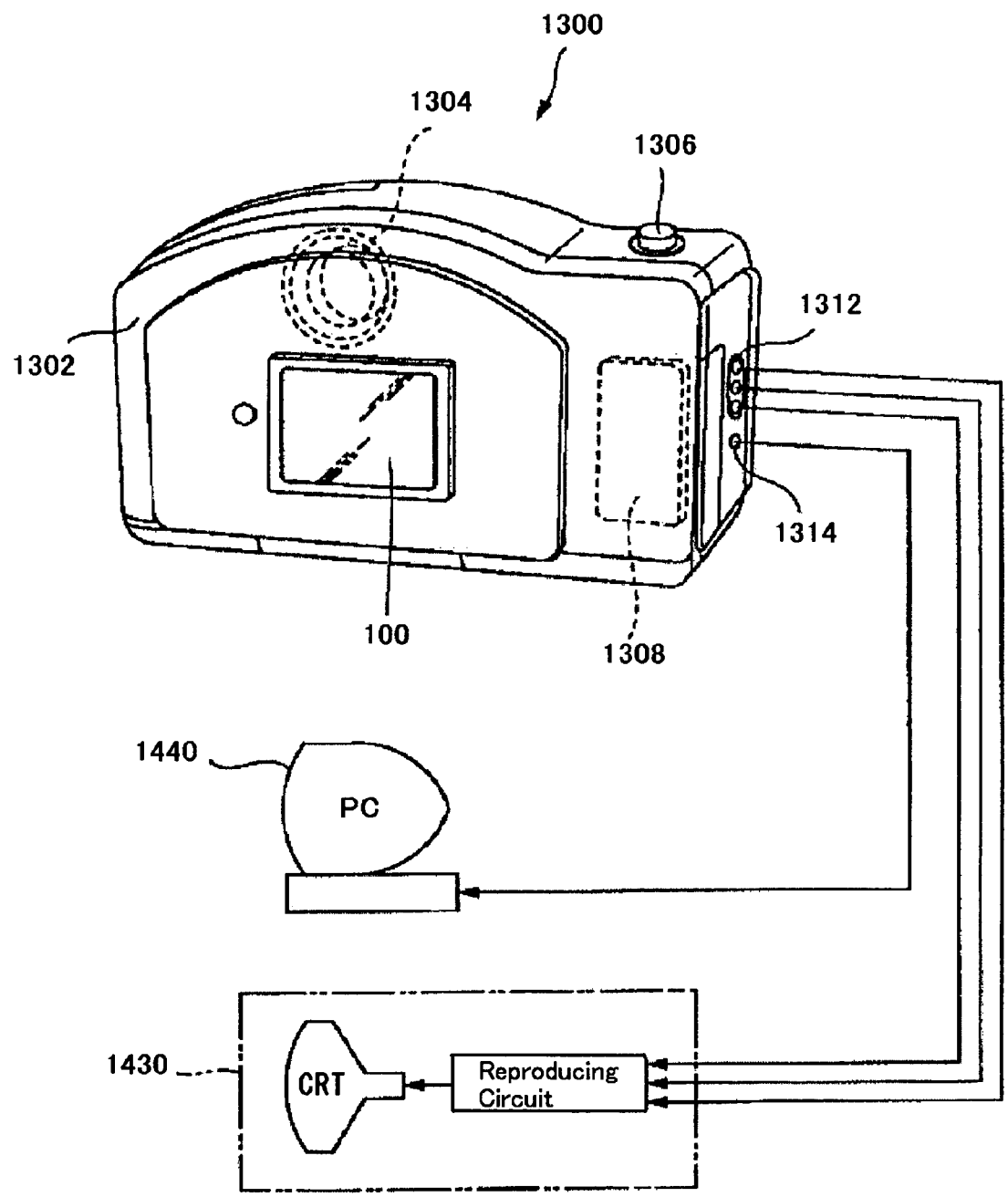
FIG. 8 is a perspective view which shows the structure of a digital still camera which is still other example of the electronic equipment according to the present invention.

FIG. 8 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display apparatus 100 as described above.

In the inside of the case, there is provided a circuit board 1308. The circuit board 1308 has a memory capable of storing an image pickup signal.

In the front surface of the case 1302 (in FIG. 8, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 8, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 6, the mobile phone shown in FIG. 7, and the digital still camera shown in FIG. 8 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The light emitting device, the method for manufacturing the light emitting device, the electronic device provided with the light emitting device, and the electronic equipment provided with the electronic device according to the present invention have been described based on the embodiments shown in the drawings, but the present invention is not limited thereto.

Next, the present invention will be described with reference to the actual examples.

1. Manufacture of Light Emitting Device

Five light emitting devices were manufactured in each of the following Examples and Comparative Examples. In each of the Examples and Comparative Examples, each light emitting device was manufactured as follows.

Example 1

<1A> First, an ITO electrode (that is, an cathode) was formed on a transparent glass substrate having an average thickness of 0.5 mm by a sputtering method so as to have an average thickness of 150 nm.

<2A> Next, a plating solution was prepared so that amounts of zinc chloride, potassium chloride, and 2',4',5',7'-tetrabromofluorescein-disodium salt (acid red 87) were 0.01 mol/L, 0.1 mol/L, and 0.1 mmol/L, respectively.

<3A> Next, the ITO electrode which was provided on the glass substrate as a cathode and a zinc substrate which was prepared as an anode were set in the plating solution, and then a voltage was applied between the cathode and the anode with a state that they were being dipped in the plating solution while supplying oxygen gas into the plating solution.

Various conditions at the time when the voltage was applied were as follows.

The applied voltage between the cathode and the anode (hydrogen reduction potential conversion) was −1.2 V. Temperature of the plating solution was 60° C. pH of the plating solution was 5.5. Oxygen flow rate was 1 sccm per 1 $cm^2$ on the ITO electrode. Time of plating (Plating time) was 20 minutes.

In this way, a zinc oxide film containing the acid red 87 and having an average thickness of 100 nm was obtained on the ITO electrode.

<4A> Next, the substrate provided with the zinc oxide film was dipped in a potassium hydroxide solution (pH=10.5) for five minutes, and then the acid red 87 contained in the zinc oxide film was eluted to obtain a porous zinc oxide film having pores.

<5A> Next, the zinc oxide film was washed by ultrapure water, and then it was dried.

<6A> Next, the substrate provided with the zinc oxide film was dipped in a coumarin 343 solution of 0.1 mol/L for seven minutes, so that the coumarin 343 was carried on an upper surface of the zinc oxide film as well as inner surfaces of the pores.

<7A> Next, the zinc oxide film was dried at the conditions of 50° C.×10 minutes under nitrogen atmosphere, and then the zinc oxide film was further dried at the conditions of 50° C.×10 minutes under reduced pressure, to thereby obtain an intermediate layer having an average thickness of 100 nm.

<8A> Next, a 1.7 wt % xylene solution of poly(9,9-dioctyl-2,7-divinylenefluorenyl-ortho-co(anthracene-9,10-diyl) (weight average molecular weight: 200,000) was applied onto the intermediate layer by a spin coating method, and it was then dried at the conditions of 100° C.×10 minutes under nitrogen atmosphere, and then further dried at the conditions of 100° C.×60 minutes under reduced pressure to thereby form a light emitting layer having an average thickness of 50 nm on the intermediate layer.

<9A> Next, a hole transport layer having an average thickness of 10 nm was formed on the light emitting layer by a vacuum evaporation of copper phthalocyanine.

<10A> Next, an Al electrode (that is, an anode) was formed on the hole transport layer by a vacuum evaporation so as to have an average thickness of 300 nm.

<11A> Next, a protection cover made of polycarbonate was provided so as to cover these layers described above, and was then secured and sealed with an ultraviolet curable resin to obtain a light emitting device.

Example 2

A light emitting device was obtained in the same manner as in Example 1, except that the acid red 87 was further added so that the concentration of the acid red 87 in the plating solution became 0.2 mol/L after ten minutes from applying the voltage in the step <3A>.

Example 3

A light emitting device was obtained in the same manner as in Example 1, except that the plating solution was prepared by omitting the addition of the acid red 87 in the step <2A>, and that the acid red 87 was added so that the concentration of the acid red 87 in the plating solution became 0.2 mol/L after ten minutes from applying the voltage in the step <3A>.

Example 4

A light emitting device was obtained in the same manner as in Example 1, except that the plating solution was prepared by omitting the addition of the acid red 87 in the step <2A>, and that the steps <4A> and <5A> were omitted.

Example 5

A light emitting device was obtained in the same manner as in Example 1, except that tetra-thiofulvalene was used as the dye instead of coumarin 343.

Example 6

A light emitting device was obtained in the same manner as in Example 2, except that tetra-thiofulvalene was used as the dye instead of coumarin 343.

Example 7

A light emitting device was obtained in the same manner as in Example 3, except that tetra-thiofulvalene was used as the dye instead of coumarin 343.

Example 8

A light emitting device was obtained in the same manner as in Example 4, except that tetra-thiofulvalene was used as the dye instead of coumarin 343.

Examples 9 to 14

In each of the Examples 9 to 14, a light emitting device was obtained in the same manner as in Example 1, except that the organic compound, the constituent material of the base, and the dye used for forming the intermediate layer were changed as shown in Table 1, respectively.

Example 15

<1B> First, a cathode, an intermediate layer, a light emitting layer, and a hole transport layer were formed on a glass substrate in this order in the same manner as the step <1A> to the step <9A>, except that malachite green was used as the organic compound, cadmium oxide was used as the constituent material of the base, and coumarin 343 was used as the dye, respectively.

<2B> Next, a transparent electrode, an intermediate layer, a light emitting layer, and a hole transport layer were formed on the hole transport layer in this order in the same manner as in the step <1B> to obtain a laminated structure 9'.

<3B> Next, an anode was formed on the hole transport layer in the same manner as in the step <10A>.

<4B> Next, the respective layers were sealed by a protection cover in the same manner as in the step <11A> to obtain a light emitting device as shown FIG. 4.

Example 16

A light emitting device was obtained in the same manner as in Example 15, except that tetra-thiofulvalene was used as the dye instead of coumarin 343.

Comparative Example 1

A light emitting device was obtained in the same manner as in Example 1, except that the steps (2A to 7A) of forming the intermediate layer was omitted.

Comparative Example 2

A light emitting device was obtained in the same manner as in Example 1, except that the intermediate layer was formed by supplying 3,4,5-triphenyl-1,2,4-triazol with a vacuum evaporation method in the step <2A> to the step <7A>.

2. Evaluation

The electrification current (A), the luminous brightness ($cd/m^2$), the maximum luminous efficiency (lm/W), and the time that elapsed before the luminous brightness became half of the initial value (that is, a half-life) of each of the light emitting devices obtained in the Examples and Comparative Examples mentioned above were measured.

In this regard, it is to be noted that these measurements were made by applying a voltage of 9 V between the ITO electrode and the Al electrode in each of the light emitting devices.

The measurement values (that is, the electrification current, the luminous brightness, the maximum luminous efficiency, and the half-life) of each of the Examples 1 to 16 and Comparative Example 2 were evaluated according to the following four criteria A to D, respectively, wherein the measurement values of the Comparative Example 1 were used as reference values.

A: The measurement value was 1.50 times or more that of the Comparative Example 1.

B: The measurement value was 1.25 times or more but less than 1.50 times that of the Comparative Example 1.

C: The measurement value was 1.00 times or more but less than 1.25 times that of the Comparative Example 1.

D: The measurement value was 0.75 times or more but less than 1.00 times that of the Comparative Example 1.

The evaluation results are shown in the attached Table 1.

Figure 9:
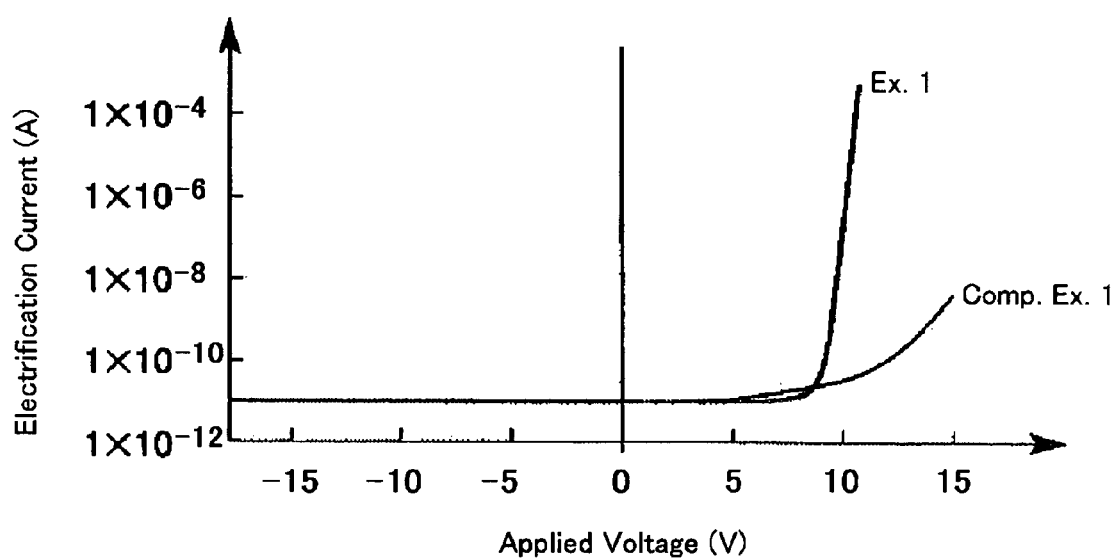
FIG. 9 is a graph which shows a relation between change of an applied voltage value and change of an electrification current value which are measured in the respective light emitting devices obtained in Example 1 and Comparative Example 1.

Further, a relation between change of the applied voltage values and change of the electrification current values in the respective light emitting devices of the Example 1 and the Comparative Example 1 are shown in the attached FIG. 9 as one example.

TABLE 1

| | Intermediate Layer | | | | | | | |
| | | Base | | | | Maximum | | |
| | Organic Compound | Constituent Material | Structure | Dye | Electrification Current | Luminous Brightness | Luminous Efficiency | Half-life |
| --- | --- | --- | --- | --- | --- | --- | --- | --- |
| Ex. 1 | Acid Red 87 | Zinc Oxide | Porous | Coumarin 343 | A-B | A-B | A-B | A-B |
| Ex. 2 | Acid Red 87 | Zinc Oxide | Porous *1 | Coumarin 343 | A | A | A | A |
| Ex. 3 | Acid Red 87 | Zinc Oxide | Dense + Porous *2 | Coumarin 343 | A | A-B | A | A-B |
| Ex. 4 | Acid Red 87 | Zinc Oxide | Dense | Coumarin 343 | B | B | B | B |
| Ex. 5 | Acid Red 87 | Zinc Oxide | Porous | Tetra-Thiofulvalene | A-B | A-B | A-B | A-B |
| Ex. 6 | Acid Red 87 | Zinc Oxide | Porous *1 | Tetra-Thiofulvalene | A | A-B | A | A |

TABLE 1-continued

| | | Intermediate Layer | | | | | | |
| | | Base | | | | Maximum | | |
| | Organic Compound | Constituent Material | Structure | Dye | Electrification Current | Luminous Brightness | Luminous Efficiency | Half-life |
|---|---|---|---|---|---|---|---|---|
| Ex. 7 | Acid Red 87 | Zinc Oxide | Dense + Porous *2 | Tetra-Thiofulvalene | A-B | A-B | A | A-B |
| Ex. 8 | Acid Red 87 | Zinc Oxide | Dense | Tetra-Thiofulvalene | B | B | B | B |
| Ex. 9 | Acid Red 87 | Zinc Oxide | Porous | Nile Red | A-B | B | A-B | A-B |
| Ex. 10 | Acid Red 87 | Zinc Oxide | Porous | Perylene | A-B | B | A-B | A-B |
| Ex. 11 | Acid Red 87 | Zinc Oxide | Porous | Quinacridone | A-B | B | A-B | A-B |
| Ex. 12 | Acid Red 87 | Zinc Oxide | Porous | Coumarin 6 | A-B | B | A-B | A-B |
| Ex. 13 | Acid Red 87 | Zinc Oxide | Porous | Rubrene | A-B | B | A-B | A-B |
| Ex. 14 | Acid Red 87 | Zinc Oxide | Porous | TPB | A-B | B | A-B | A-B |
| Ex. 15 | Malachite Green | Cadmium Oxide | Porous | Coumarin 343 | B | B | A-B | A-B |
| Ex. 16 | Malachite Green | Cadmium Oxide | Porous | Tetra-Thiofulvalene | B | B | A-B | A-B |
| Comp. Ex. 1 | Acid Red 87 | | | — | | | | |
| Comp. Ex. 2 | Acid Red 87 | | 3,4,5-triphenyl-1,2,4-triazol | | C | C | C | C |

*1: Pores exist in base in unevenly distributed manner on side of base adjacent to light emitting layer.
*2: Side of base adjacent to light emitting layer is formed into porous.

As shown in Table 1, all the light emitting devices of each of the Examples were superior to the light emitting devices of each of the Comparative Examples in their electrification current, luminous brightness, maximum luminous efficiency, and half-life.

From these results, it has been apparent that in each of the light emitting devices of the present invention, the adhesion at the interface between the cathode and the intermediate layer and the adhesion at the intermediate layer and the light emitting layer were both improved, and therefore transfer of electrons from the cathode to the light emitting layer through the intermediate layer was carried out smoothly.

Further, such a tendency was observed in each of the Examples 2, 3, 6 and 7 conspicuously. This is supposed to result from the reason that since in each of the light emitting devices of these Examples the pores existed in the base in an unevenly distributed manner to the side of the light emitting layer, the adhesion of the intermediate layer with respect to the cathode and the light emitting layer was further improved.

According to the present invention, a light emitting device is provided with an intermediate layer between a light emitting layer and a cathode. The intermediate layer includes a base which is constituted of a metal oxide based semiconductor material as a main component thereof and a dye which is carried on an upper surface of the base and inner surfaces of pores formed in the base so as to be in contact with the light emitting layer.

It is to be noted that since both the cathode and the base are constituted of inorganic materials as a main component thereof, the base exhibits excellent adhesion with respect to the cathode. This makes it possible to reduce resistance in the vicinity of an interface between the cathode and the base, thereby making it possible to smoothly inject electrons from the cathode to the base.

Further, since the dye is carried on the upper side of the base, it is possible to transfer the electrons injected into the base to the dye smoothly.

Furthermore, since the dye is in contact with the light emitting layer and both the dye and the light emitting layer are constituted of organic materials as a main component thereof, the dye exhibits excellent adhesion with respect to the light emitting layer. This makes it possible to inject the electrons from the dye to the light emitting layer smoothly.

INDUSTRIAL APPLICABILITY

As described above, since the intermediate layer having such a structure is provided between the cathode and the light emitting layer, it is possible to smoothly transfer the electrons, which are injected from the cathode, to the light emitting layer through the intermediate layer. As a result, it is possible to increase the luminous efficiency of the light emitting layer. Further, according to the method for manufacturing a light emitting device of the present invention, the light emitting device having the structure as described above can be manufactured. Furthermore, an electronic device provided with the light emitting devices each having the above-described structure and electronic equipment provided with the electronic device can have high reliability. Therefore, the present invention has industrial applicability.

What is claimed is:
1. A light emitting device comprising:
a cathode;
an anode;
a light emitting layer provided between the cathode and the anode; and
an intermediate layer provided between the cathode and the light emitting layer in contact with both the cathode and the light emitting layer, the intermediate layer being configured to transport electrons from the cathode to the light emitting layer;
wherein the intermediate layer comprises:
a base in the form of a layer, the base being constituted of at least one metal oxide based semiconductor material as a main component thereof and having a first surface which is in contact with the light emitting layer and a second surface opposite to the first surface; and
a dye carried on at least the first surface of the base so as to be in contact with the light emitting layer, and
wherein the base is formed into a porous structure having many pores defined by inner surfaces, the dye is carried on the first surface of the base as well as the inner surfaces of the pores, and the pores exist in the base in an unevenly distributed manner to the side of the first surface of base in a thickness direction thereof.

2. The light emitting device as claimed in claim 1, Wherein at least one metal oxide based semiconductor material includes at least one of zinc oxide and cadmium oxide.

3. The light emitting device as claimed in claim 1, wherein an average porosity of the pores of the base is in the range of 20 to 60%.

4. The light emitting device as claimed in claim 1, wherein a part of the light emitting layer enters into the pores.

5. The light emitting device as claimed in claim 1, wherein the dye is constituted of at least one of a coupling polycyclic dye and a fused polycyclic dye as a main component thereof.

6. The light emitting device as claimed in claim 5, wherein the coupling polycyclic dye is at least one of tetra-thiofulvalene, coumarin 6, rubrene, 1,1,4,4-tetraphenyl-1,3-butadiene, 2-(4-tert-butylphenyl)-5-(4-biphenyl)-1,3,4-oxadiazol, 2,5-bis(1-naphtyl)-1,3,4-oxadiazol, 3-(4-biphenyl)-4-phenyl-5-(4-tert-butylphenyl)-1,3,4-triazol, and 1,3-bis[5-(p-4-tert-butylphenyl)-1,3,4-oxadiazol-2-yl]benzene.

7. The light emitting device as claimed in claim 5, wherein the fused polycyclic dye is at least one of coumarin 343, Nile red, perylene, quinacridone, and N,N'-dimethylquinacridone.

8. The light emitting device as claimed in claim 1, wherein an average thickness of the intermediate layer is in the range of 1 to 500 nm.

9. The light emitting device as claimed in claim 1, wherein the cathode is constituted of conductive metal oxides as a main component thereof.

10. An electronic device provided with the light emitting device defined in claim 1.

11. Electronic equipment provided with the electronic device defined in claim 10.

* * * * *